(12) United States Patent
Pegna et al.

(10) Patent No.: US 11,362,256 B2
(45) Date of Patent: Jun. 14, 2022

(54) FUNCTIONAL HIGH-PERFORMANCE FIBER STRUCTURE

(71) Applicant: FREE FORM FIBERS, LLC, Saratoga Springs, NY (US)

(72) Inventors: Joseph Pegna, Saratoga Springs, NY (US); Ram K. Goduguchinta, Ballston Lake, NY (US); Kirk L. Williams, Saratoga Springs, NY (US); John L. Schneiter, Cohoes, NY (US); Shay L. Harrison, East Schodack, NY (US); Erik G. Vaaler, Redwood City, CA (US)

(73) Assignee: FREE FORM FIBERS, LLC, Saratoga Springs, NY (US)

( * ) Notice: Subject to any disclaimer, the term of this patent is extended or adjusted under 35 U.S.C. 154(b) by 114 days.

(21) Appl. No.: 16/019,839

(22) Filed: Jun. 27, 2018

(65) Prior Publication Data

US 2018/0370860 A1    Dec. 27, 2018

Related U.S. Application Data

(60) Provisional application No. 62/525,288, filed on Jun. 27, 2017.

(51) Int. Cl.
*H01L 35/34* (2006.01)
*D01F 9/08* (2006.01)
(Continued)

(52) U.S. Cl.
CPC .............. *H01L 35/34* (2013.01); *B32B 19/06* (2013.01); *C04B 35/5158* (2013.01);
(Continued)

(58) Field of Classification Search
CPC ......... H01L 35/34; H01L 35/04; H01L 35/28; H01L 41/047; H01L 41/0805;
(Continued)

(56) References Cited

U.S. PATENT DOCUMENTS 3,062,683 A    11/1962   Kalleberg et al.
3,148,102 A     9/1964   Eakins et al.
(Continued)

FOREIGN PATENT DOCUMENTS

CN    103387230 A    11/2013
EP     1 209 123 A2   5/2009
(Continued)

OTHER PUBLICATIONS

Wallenberger, "Strong, Small Diameter, Boron Fibers by LCVD", Materials Letters, vol. 14 (1992), pp. 198-202.
(Continued)

*Primary Examiner* — James M Mellott
(74) *Attorney, Agent, or Firm* — Kevin P. Radigan, Esq.; Heslin Rothenberg Farley & Mesiti P.C.

(57) ABSTRACT

A method is provided for growing a fiber structure, where the method includes: obtaining a substrate, growing an array of pedestal fibers on the substrate, growing fibers on the pedestal fibers, and depositing a coating surrounding each of the fibers. In another aspect, a method of fabricating a fiber structure includes obtaining a substrate and growing a plurality of fibers on the substrate according to 1½D printing. In another aspect, a multilayer functional fiber is provided produced by, for instance, the above-noted methods.

15 Claims, 24 Drawing Sheets

(51) Int. Cl.

| | | |
|---|---|---|
| *D01F 8/18* | (2006.01) | |
| *H01L 35/04* | (2006.01) | |
| *H01L 35/28* | (2006.01) | |
| *C23C 16/54* | (2006.01) | |
| *H01L 41/047* | (2006.01) | |
| *C23C 16/48* | (2006.01) | |
| *C04B 35/628* | (2006.01) | |
| *B32B 19/06* | (2006.01) | |
| *C04B 35/515* | (2006.01) | |
| *C04B 35/76* | (2006.01) | |
| *C04B 35/565* | (2006.01) | |
| *C04B 35/622* | (2006.01) | |
| *C23C 16/30* | (2006.01) | |
| *C04B 35/80* | (2006.01) | |
| *C04B 35/56* | (2006.01) | |
| *C23C 16/04* | (2006.01) | |
| *H01L 41/08* | (2006.01) | |
| *H01L 41/087* | (2006.01) | |

(52) U.S. Cl.
CPC ........ *C04B 35/565* (2013.01); *C04B 35/5622* (2013.01); *C04B 35/62272* (2013.01); *C04B 35/62277* (2013.01); *C04B 35/62863* (2013.01); *C04B 35/62873* (2013.01); *C04B 35/62884* (2013.01); *C04B 35/76* (2013.01); *C04B 35/80* (2013.01); *C23C 16/047* (2013.01); *C23C 16/30* (2013.01); *C23C 16/483* (2013.01); *C23C 16/545* (2013.01); *D01F 8/18* (2013.01); *D01F 9/08* (2013.01); *H01L 35/04* (2013.01); *H01L 35/28* (2013.01); *H01L 41/047* (2013.01); *H01L 41/0805* (2013.01); *H01L 41/087* (2013.01); *C04B 2235/3256* (2013.01); *C04B 2235/3258* (2013.01); *C04B 2235/524* (2013.01)

(58) Field of Classification Search
CPC .................. H01L 41/087; B32B 19/06; C04B 2235/3256; C04B 2235/3258; C04B 2235/524; C04B 35/5158; C04B 35/5622; C04B 35/565; C04B 35/62272; C04B 35/62277; C04B 35/62844; C04B 35/62863; C04B 35/62873; C04B 35/62884; C04B 35/76; C04B 35/80; D01F 8/18; D01F 9/08; C23C 16/047; C23C 16/30; C23C 16/483; C23C 16/545

See application file for complete search history.

(56) References Cited

U.S. PATENT DOCUMENTS

| | | |
|---|---|---|
| 3,755,061 A | 8/1973 | Schurb |
| 3,958,406 A | 5/1976 | Corbiere |
| 4,076,380 A | 2/1978 | DiMarcello |
| 4,539,248 A | 9/1985 | Brockington et al. |
| 4,588,699 A | 5/1986 | Brennan et al. |
| 4,962,070 A | 10/1990 | Sullivan |
| 5,096,739 A | 3/1992 | Strutt et al. |
| 5,134,020 A | 7/1992 | Cotteret et al. |
| 5,296,288 A | 3/1994 | Kourtides et al. |
| 5,326,731 A | 7/1994 | Bhola et al. |
| 5,342,022 A | 8/1994 | Artjushenko et al. |
| 5,399,430 A | 3/1995 | Nordine et al. |
| 5,705,122 A | 1/1998 | Curran |
| 5,786,023 A | 7/1998 | Maxwell et al. |
| 5,955,391 A | 9/1999 | Kameda et al. |
| 6,183,714 B1 | 2/2001 | Smalley et al. |
| 6,291,058 B1 | 9/2001 | Goujard et al. |
| 6,322,889 B1 | 11/2001 | Lara-Curzio et al. |
| 6,323,413 B1 | 11/2001 | Roth et al. |
| 6,706,400 B2 | 3/2004 | Mercuri et al. |
| 7,657,142 B2 | 2/2010 | Gasca et al. |
| 7,666,475 B2 | 2/2010 | Morrison |
| 9,206,508 B1 | 12/2015 | Hariharan et al. |
| 9,217,210 B2 | 12/2015 | Velev et al. |
| 9,658,087 B1 | 5/2017 | Baur et al. |
| 9,896,385 B2 | 2/2018 | Harrison et al. |
| 9,938,393 B2 | 4/2018 | Schneiter et al. |
| 2002/0085968 A1 | 7/2002 | Smalley |
| 2005/0048859 A1 | 3/2005 | Canahan et al. |
| 2005/0082676 A1 | 4/2005 | Andry et al. |
| 2005/0181192 A1 | 8/2005 | Steffier |
| 2005/0247904 A1 | 11/2005 | Raj et al. |
| 2005/0255033 A1 | 11/2005 | Shimoji et al. |
| 2006/0039524 A1 | 2/2006 | Feinroth et al. |
| 2006/0115648 A1 | 6/2006 | Chen |
| 2007/0093587 A1 | 4/2007 | Shen et al. |
| 2008/0143209 A1 | 6/2008 | Tan et al. |
| 2008/0153959 A1 | 6/2008 | Charati et al. |
| 2008/0175988 A1 | 7/2008 | Chiu et al. |
| 2009/0064476 A1 | 3/2009 | Cross et al. |
| 2010/0040834 A1 | 2/2010 | Dawes et al. |
| 2010/0055352 A1 | 3/2010 | Maxwell |
| 2010/0261058 A1 | 10/2010 | Lopatin et al. |
| 2011/0124483 A1 | 5/2011 | Shah et al. |
| 2011/0170653 A1 | 7/2011 | Cabrero et al. |
| 2011/0274906 A1 | 11/2011 | Kim et al. |
| 2011/0286570 A1 | 11/2011 | Farmer et al. |
| 2012/0002777 A1 | 1/2012 | Lahoda et al. |
| 2012/0076718 A1 | 3/2012 | Liu et al. |
| 2012/0135224 A1 | 5/2012 | Guzman de Villoria et al. |
| 2012/0207264 A1* | 8/2012 | Van Den Berghe ... G21C 3/626 376/414 |
| 2012/0287553 A1 | 11/2012 | Ramani et al. |
| 2012/0315467 A1 | 12/2012 | Lafdi et al. |
| 2012/0315815 A1 | 12/2012 | Fong et al. |
| 2013/0010915 A1 | 1/2013 | Gamier et al. |
| 2013/0077731 A1 | 3/2013 | Sherwood et al. |
| 2013/0093122 A1 | 4/2013 | Schultz et al. |
| 2013/0163711 A1 | 6/2013 | Zabiego et al. |
| 2013/0329849 A1 | 12/2013 | Mazaudier |
| 2014/0170919 A1 | 6/2014 | Manipatruni et al. |
| 2015/0004393 A1* | 1/2015 | Pegna ..................... C04B 35/76 428/311.51 |
| 2016/0347672 A1 | 12/2016 | Harrison |
| 2017/0213604 A1 | 7/2017 | Pegna et al. |
| 2017/0326838 A1 | 11/2017 | Pegna et al. |
| 2017/0331022 A1 | 11/2017 | Pegna et al. |
| 2017/0369998 A1 | 12/2017 | Pegna et al. |
| 2018/0087157 A1 | 3/2018 | Harrison et al. |
| 2018/0087214 A1 | 3/2018 | Harrison et al. |
| 2018/0148864 A1 | 5/2018 | Harrison et al. |

FOREIGN PATENT DOCUMENTS

| | | |
|---|---|---|
| GB | 2054542 B | 1/1983 |
| JP | 61-132628 A | 6/1986 |
| JP | H 03-285877 A | 12/1991 |
| JP | H 07-252662 A | 3/1995 |
| JP | H 09-268065 A | 10/1997 |
| JP | H 10-059780 A | 3/1998 |
| JP | 2002-211980 A | 7/2002 |
| JP | 2005-231952 A | 9/2005 |
| JP | 2013-210372 A | 10/2013 |
| WO | WO 1988/001204 A1 | 2/1988 |
| WO | WO 2010/090624 A1 | 8/2010 |
| WO | WO 2012/109841 A1 | 8/2012 |
| WO | WO 2013/180764 A1 | 12/2013 |
| WO | WO 2014/143937 A1 | 9/2014 |
| WO | WO 2015/200257 A1 | 12/2015 |
| WO | WO-2015200257 A1 * | 12/2015 ......... C04B 35/6286 |

OTHER PUBLICATIONS

Johansson et al., "Microfabrication of Three-Dimensional Boron Structures by Laser Chemical Processing", J. Appl. Phys., vol. 72 (12), Dec. 19, 1992 (8 pages).

(56) References Cited

OTHER PUBLICATIONS

Wallenberger, Frederick T., "Inorganic Fibres and Microfabricated Parts by Laser Assisted Chemical Vapour Deposition (LCVD): Structures and Properties*", Ceramics International, 23 (1995) (8 pages).

Maxwell et al., "Real-Time Volumetric Growth Rate Measurements and Feedback Control of Three-Dimensional Laser Chemical Vapor Deposition)", Appl. Phys. A, vol. 67, No. 3, 1998 (7 pages).

Waku et al., "An Amorphous Ceramic Al32.4Er7.6O60 Fiber with Large Viscous Flow Deformation and a High-Strength Nanocrystallized Ceramic Fiber", Journal of Materials Science, vol. 36, No. 10, pp. 2435-2440 (May 15, 2001).

Wen et al., "Interfacial Microstructure and Reaction of BN-Coated Single Crystal Al2O3 Fiber Reinforced NiAl Matrix Composites", Journal of Materials Science, vol. 37, No. 6, Mar. 1, 2002 (pp. 1253-1258).

Kerans, "High Temperature Composites", Air Force Research Laboratory Report No. AFRL-ML-WL-TP-2002-407, Aug. 2002 (22 pages).

Kerans et al., "Interface Design for Oxidation-Resistant Ceramic Composites", Journal of the American Ceramic Society, vol. 85, No. 11, pp. 2599-2632 (Nov. 1, 2002).

Behlau et al., "Mechanical Properties of Carbon and BN Coated SiC Fibers", Ceramic Engineering and Science Proceedings, vol. 24, No. 4, Jan. 1, 2003 (pp. 225-230).

Chen et al., "Carbide Derived Carbon (CDC) Coatings for Tyranno ZMI SiC Fibers", Ceramic Engineering and Science Proceedings, vol. 24, No. 3, Jan. 26, 2003 (pp. 57-62).

Chen et al., "Carbothermal Synthesis of Al—O—N Coatings Increasing Strength of SiC Fibers", International Journal of Applied Ceramic Technology, vol. 1, No. 1, Jan. 1, 2004 (pp. 68-75).

Lee et al., "Microstructure and Mechanical Properties of Al2O3/Y3Al5O12/ZrO2 Ternary Eutectic Materials", Journal of European Ceramic Society, vol. 25, No. 8, pp. 1411-1417 (Jan. 1, 2005).

Maxwell et al., "Preparation of Superhard BxCy Fibers by Microvortex-Flow Hyperbaric Laser Chemical Deposition", Diamon & Related Materials, vol. 16, Jan. 2007 (1557-1564).

Longtin et al., "Systhesis of Carbon Nanofiber Films and Nanofiber Composite Coatings by Laser-Assisted Catalytic Chemical Vapor Deposition", Thin Solid Films, vol. 515 (2007) pp. 2958-2964.

Longtin et al., "Selective Area Synthesis of Aligned Carbon Nanofibers by Laser-Assisted Catalytic Chemical Vapor Deposition", Diamond and Related Materials, vol. 16 (2007) pp. 1541-1549.

Liao et al., "Large-Scale Aligned Silicon Carbonitride Nanotube Arrays: Synthesis, Characterization, and Field Emission Property", Journal of Applied Physics, vol. 101, No. 11, pp. 114306.1-114306.4 (Jun. 7, 2007).

Hu et al., "Oxidation Behavior of Zirconium Diboride-Silicon Carbide at 1800° C.", Scripta Materialia, vol. 57, No. 9, Nov. 2007 (pp. 825-828).

Marsh, "Quantum Well Intermixing Revolutionizes High Power Laser Diodes", Diodenlaser, LTJ No. 5, 4:32-35, doi:10.1002/latj.200790190 (Nov. 2007) (4 pages).

Liu et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, Oct. 1, 2008 (pp. 3670-3672).

Jouanny et al., "Study of TiC Coatings on Nicalon Fibre Prepared by Pressure-Pulsed Reactive Chemical Vapour Deposition at Low Pressure", ECS Translations, vol. 25, No. 8, Jan. 1, 2009 (pp. 1267-1272).

Roy et al., "Atomic Layer Deposition of Alumina Onto Carbon Fibers", Journal of the American Ceramic Society, vol. 94, No. 7, pp. 2014-2022 (Jul. 1, 2011).

Zhang et al., "Ferromagnetism Induced by Intrinsic Defects and Boron Substitution in Single-Wall SiC Nanotubes", Journal of Physical Chemistry, vol. 115, No. 35, pp. 9987-9992 (Sep. 8, 2011).

Gan, Structural assessment of nanocomposites, Micron 43 (2012) pp. 782-817.

Ares et al. Columnar-to-Equiaxed Transition in Metal_matrix Composites Reinforced with Silicon Cabide Particles, Hindawi Publishing Corporation, Journal of Metallurgy, vol. 2013, Article ID 628495, 12 pages.

Glazoff et al., "Morphological Analysis of Zirconium Nuclear Fuel Rods Braided with SiC: Qality Assurance and Defect Identification", Journal of Nuclear Materials, 451.1 (Apr. 12, 2014) (pp. 216-224).

Wang et al., "UV Laser-Assisted Diamond Deposition", Nov. 2014 (100 pages), http://digitalcommons.uni.edu/cgi/viewcontent.cgi?article=1068&context=elecengtheses.

Luo et al. Microstructure, tensile strength and thermostability of W-core SiC fibers with or without carbonb coating, Materials Science & Engineering A 647 (2015) pp. 265-276.

Wang et al., "Synthesis of ZrC—SiC Powders from Hybrid Liquid Precursors with Improved Oxidation Resistance", Journal of the American Ceramic Society, vol. 98, No. 1, Jan. 2015 (pp. 197-204).

Jiang et al., "Fabrication of Barium-Strontium Aluminosilicate Coatings on C/SiC Composites via Laser Cladding", Journal of Materials Science & Technology, vol. 33, No. 2, Dec. 23, 2016 (pp. 167-168, 171).

Zimmerman et al. Fragmentation-driven grain refinement in directional solidification of AiCu10wit-% alloy at low pulling speeds, Acta Materialia 126 (2017) pp. 236-250.

Harrison et al., "High Temperature Glass-Ceramic Matrix With Embedded Reinforcement Fibers", U.S. Appl. No. 16/011,698, filed Jun. 19, 2018 (39 pages).

Pegna et al., "High Strength Ceramic Fibers And Methods of Fabrication", U.S. Appl. No. 16/101,730, filed Aug. 13, 2018 (66 pages).

Maxwell et al., "High Temperature Nanocomposites for Nuclear Thermal Propulsion and In-Space Fabrication by Hyperbaric Pressure Laser Chemical Vapor Deposition", Journal of the British Interplanetary Society (JBIS), vol. 66, pp. 328-333 (Year: 2013).

Supplementary European Search Report for EP Application No. 18825484.1, dated Apr. 23, 2021 (.

* cited by examiner

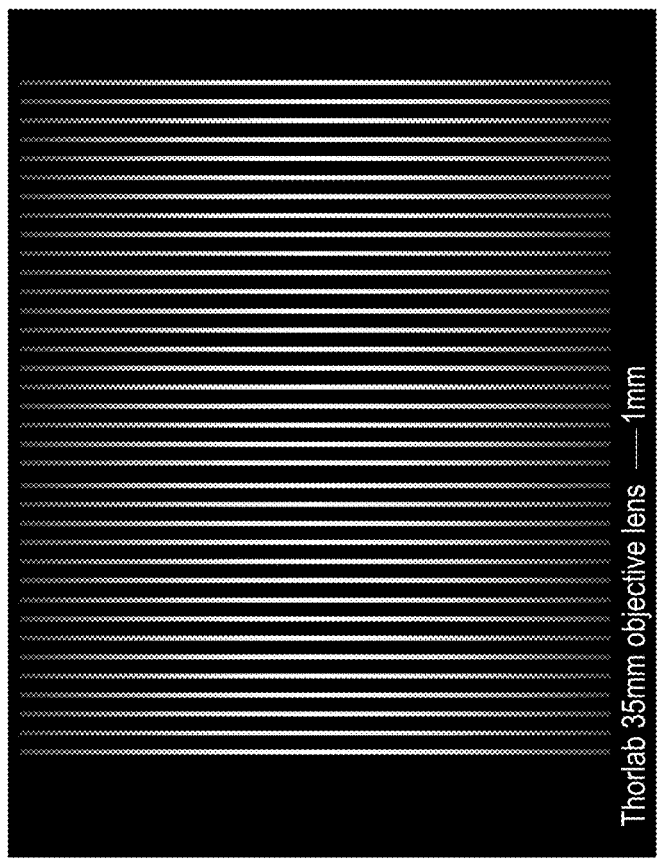
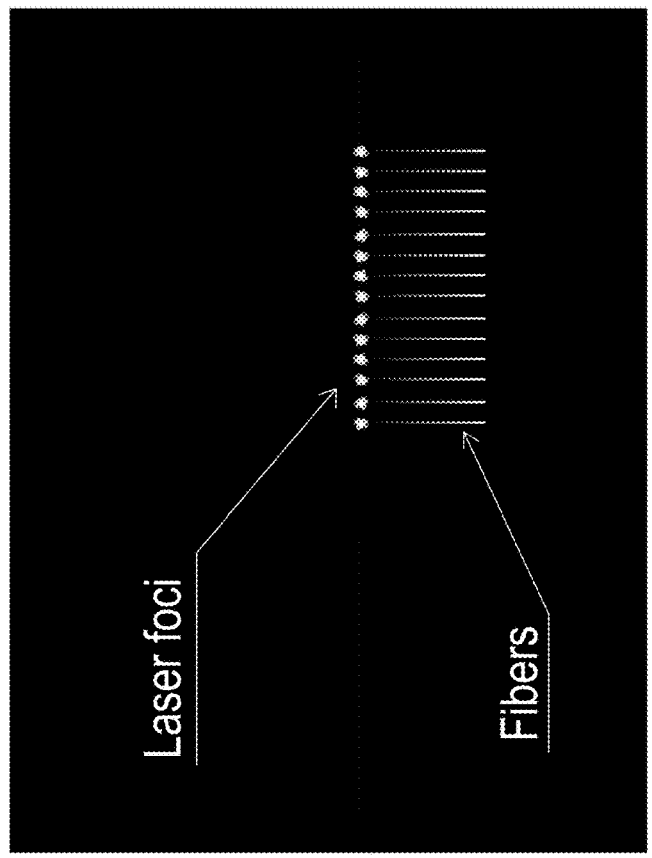
FIG. 4

FUNCTIONAL HIGH-PERFORMANCE FIBER STRUCTURE

CROSS-REFERENCE TO RELATED APPLICATIONS

This application claims the benefit of the following patent applications, which are hereby incorporated herein by reference in their entirety: U.S. Provisional Patent Application No. 62/525,288, filed Jun. 27, 2017, entitled "Functional High-Performance Fiber Forest"; U.S. Patent Publication No. 2015/0004393 A1, which published Jan. 1, 2015, entitled "High Strength Ceramic Fibers and Methods of Fabrication"; PCT Publication No. WO 2013/180764 A1, which published Dec. 5, 2013, entitled "High Strength Ceramic Fibers and Methods of Fabrication"; U.S. Patent Publication No. 2017/0213604 A1, which published Jul. 27, 2017, entitled "An Additive Manufacturing Technology for the Fabrication and Characterization of Nuclear Reactor Fuel"; PCT Publication No. WO 2015/200257 A1, which published Dec. 30, 2015, entitled "An Additive Manufacturing Technology for the Fabrication and Characterization of Nuclear Reactor Fuel"; U.S. Patent Publication No. 2017/0331022 A1, which published Nov. 16, 2017, entitled "Multilayer Functional Fiber and Method of Making"; PCT Publication No. WO 2017/197105 A1, which published Nov. 16, 2017, entitled "Multilayer Functional Fiber and Method of Making"; U.S. Patent Publication No. 2017/326838 A1, which published Nov. 16, 2017, entitled "Fiber Delivery Assembly and Method of Making"; and PCT Publication No. WO 2017/197082 A1, which published Nov. 16, 2017, entitled "Fiber Delivery Assembly and Method of Making", each of which is hereby incorporated herein by reference in its entirety.

STATEMENT REGARDING GOVERNMENT RIGHTS

Certain aspects of this invention were made with United States Government support under a U.S. Department of Energy Award DE-SC0011954. Accordingly, the U.S. Government may have certain rights in this invention.

BACKGROUND

The present invention relates generally to the field of raw materials in fiber form, fibers for reinforcing materials, and more specifically to the field of printed fiber arrays for providing specific functionalities, such as, for example, 3-D reinforcement, sensing, actuating, energy absorption, energy storage, or combinations thereof.

SUMMARY

As described herein, fibers can be printed using laser induced chemical vapor deposition (LCVD) processes on a substrate, said substrate needs not be flat and may itself consists of a previously fabricated fiber structure fabricated according to the present invention. These fibers can be used in numerous applications including, but not limited to, 3-D reinforcement, sensing, actuating, energy absorption, energy storage, or combinations thereof. Due to the additive manufacturing process of LCVD, the material of the fibers can be changed at any point in the process. Opportunities exist, therefore, to improve fibers grown on substrates, vary the material used, and create new purposes for fibers.

The opportunities described above are addressed, in one aspect of the present invention, by a method for fabricating a fiber structure. The method includes providing a substrate, and growing a plurality of fibers on the substrate using 1½D—printing, which can include in some embodiments, laser chemical vapor deposition.

In one or more embodiments, disclosed herein is another method of growing a fiber structure, which includes providing a substrate, growing an array of pedestal fibers on the substrate, growing fibers on the pedestal fibers, and depositing a coating surrounding each of the fibers.

In one or more embodiments, disclosed herein is a multilayer functional fiber of a fiber structure, the multilayer functional fiber including a scaffold fiber, a first functional layer enclosing the scaffold fiber, a functional layer enclosing the first functional layer, each functional layer having a functional characteristic varying as a function of longitudinal position along the functional layer, a second functional layer enclosing the functional layer, and a cladding layer enclosing the second functional layer.

Additional features and advantages are realized through the techniques of the present invention. Other embodiments and aspects of the invention are described in detail herein and are considered a part of the claimed invention.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 4 shows parallel LCVD growth of carbon fibers using a module including 64 individually controlled laser emitters, in accordance with the present invention;

DETAILED DESCRIPTION

Figure 1:
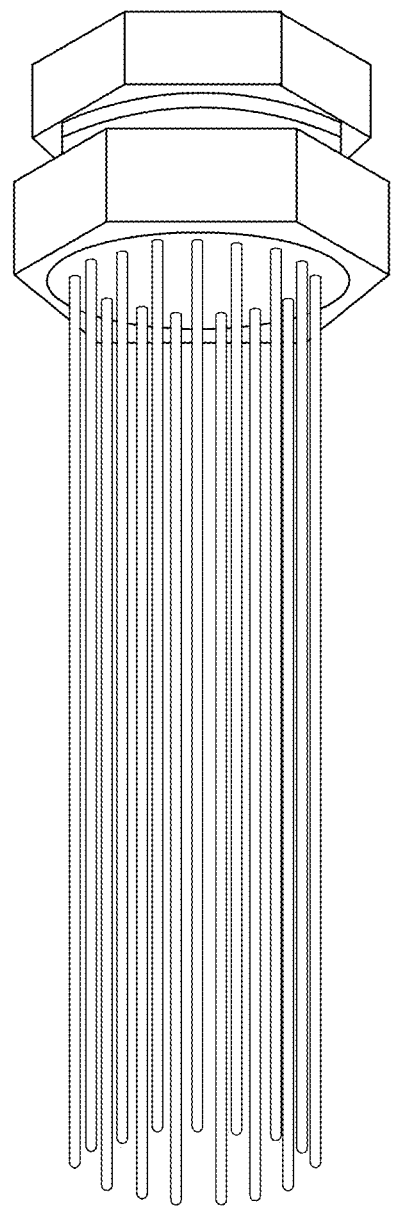
FIG. 1 is a schematic representation of a spinneret, a plate with a pattern of tiny holes through which a liquid precursor is fed, and upon exit, the stream pattern gels into filaments called "green fibers"

Aspects of the present invention and certain features, advantages and details thereof, are explained more fully below with reference to the non-limiting example(s) illustrated in the accompanying drawings. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application, for instance, for facilitating growing fiber structures and providing multilayer functional fibers as part of a fiber structure, as described herein.

This invention rests upon a novel manufacturing paradigm, inspired from cross-cutting advances in additive manufacturing ('AM'), micro-electromechanical-systems ('MEMS') design and nano-fabrication, and ceramic matrix composites ('CMCs').

Before describing the above-noted aspects further, some definitions are provided which will aid in the below description.

Additive Manufacturing ('AM') generally refers to the act of building up a material object by incretion or accretion.

Incretion is usually common in biological constructs, where the elemental building material comes in the form of cells that are created, transported and deposited in place by the construct itself. Examples of material objects built by incretion include fingernails, hair, bones, shells, plants, muscles, etc. Incretion is a natural characteristic of living organisms' growth and maintenance and does not appear to have any obvious technological equivalent.

Accretion refers to the process of adding constitutive material over a substrate and is found both in natural and technological constructs. Examples of accretion include natural geological formations like sand dunes, alluvial plains, stalactites and stalagmites, architectural constructs such as the pyramids or modern buildings, or technological artifacts such as vehicles. In all instances the material object resulting from accretion is the result of joining constitutive elements. In the case of alluvial plains, it may be boulders, rocks, and alluviums transported and deposited by natural water flows. In the case of dunes, the constitutive elements are grains of sand transported and deposited by air flows. In the case of stalactites and stalagmites, the constitutive elements are molecular elements coming out of solution and accreting. Architectural structures like the pyramids are an accretion of cut quarried stones, whereas modern buildings are an accretion of beams, shells, blocks, held together by fasteners or bonding agents like concrete. Many technological objects, like vehicles, are made up of accretion of components that are cut out or formed out of a generic stock, or components that are an assembly thereof.

Additive manufacturing is a technological implementation of accretion whereby generic constituents are joined together to form the desired material object, usually under computer control. The generic constituents can come in the form of elemental molecules, point-like elements such as powders, line-like elements such as fibers, filaments, and extruded pastes, surface-like elements such as tapes and sheets, or volume-like elements such as bricks. Examples of additive manufacturing processes that proceed from elemental molecules include Chemical Vapor Deposition (CVD) or Physical Vapor Deposition (PVD) used in producing microelectronics. Numerous additive manufacturing processes proceed from flat layers of powder where individual grains are joined together selectively and bonded to the underlying layer to form an incremental cross-sectional layer of the object under construction. Filament winding and fused deposition modeling are examples of additive manufacturing processes where the constitutive material is brought in as a line-like element. Tape layup and laminated object manufacturing are examples of additive manufacturing processes where the constitutive elements are brought in as sheet-like elements.

Note that when additive manufacturing processes build up a material object in layers, those layers do not need to be flat. When they are, however, the technique is usually referred to as "3-D printing" by analogy to 2-D printing on a sheet of paper.

Additive manufacturing, as disclosed in certain embodiments herein, can have a great affect on nuclear fuel design and many other composite structures where added functionalities can be built into the constitutive fibers. This appears especially true for disruptive advanced fuel concepts (AFC) that are not conceivable without the extreme flexibility of AM. An opportunity exists in design methodology for particular fuels exhibiting enhanced accident tolerance, increased efficiency, and smaller environmental footprint than the standard $UO_2$—Zr system. The fundamental AM technique upon which embodiments of this invention are based is known as Laser-Induced Chemical Vapor Deposition (LCVD).

The vast majority of previous additive manufacturing processes are strongly dependent upon the properties of the build material. For example, joining powders by locally melting them requires a precise knowledge of the melting point and a precise control of the local temperature during buildup. Very few additive manufacturing processes can function independently of material properties, those that do are called "Material Agnostic".

LCVD is used in embodiments disclosed herein as the fundamental AM tool due to its near material independence, which is an extremely rare property for AM processes. LCVD is a technique derived from CVD, used intensively in the microelectronics fabrication industry (aka "Chip Fab"). CVD builds up electronics-grade high-purity solid deposits from a gas precursor. In its 75+ year history, Chip Fab has accumulated an impressive library of chemical precursors for a wide range of materials, numbering in the 10's of thousands, including fissile material precursors (e.g. $UF_6$). The main difference between CVD and LCVD resides in dimensionality and mass throughput. CVD is intended for 2-D film growth whereas LCVD is ideally suited for one-dimensional filamentary structures. The dimensionality difference means that deposition mechanisms are greatly enhanced for LCVD vs. CVD, leading to deposited mass fluxes ($kg/m^2$ s) that are 3 to 9 orders of magnitude greater. For example, diamond-like carbon filaments have been measured at linear growth rates upwards of 13 cm/s, which represents a 9 order of magnitude increase in mass flux compared to thin film CVD of the same material. Finally, compared to extant fuel manufacturing, LCVD is essentially containerless, which virtually eliminates opportunities for material contamination by container or tool. Thus, according to embodiments disclosed herein, LCVD, and 1½D—printing, further described below, allow for the material of a fiber to be tightly controlled. Additionally, due to the change in focus of the laser and the containerless growth, the material of a fiber is capable of being altered or completely changed to a new material system in situ, that is, during growth of a fiber, allowing for nearly instantaneous changes to the material system of the fiber. Benefits of the material agnostic growth will be further described below.

Many applications of this invention, including nuclear applications, are enhanced by material-agnostic AM processing; for example the capability to process nuclear fuels and nuclear reactor-grade materials in a manner that is material agnostic.

As described herein, a new design space is described in one or more embodiments, from which manufacturing can emerge as an axiomatic-based science. The ability to print fibers, in some embodiments on a substrate, and in further embodiments many fibers in an array simultaneously, describe fundamental properties formally defined as "1½-D Printing" AM (by analogy to 3-D printing).

To implement 1½-D printing, Laser Induced Chemical Vapor Deposition (LCVD) was chosen as the fundamental Additive Manufacturing (AM) tool for its near material independence—an extremely rare property for AM processes. Such a process is said to be "Material Agnostic".

For the purpose of this application, the term "1½-D Printing" designates an AM process exhibiting the following defining properties:

1. Material-agnostic ability to grow fibers or filaments;
2. Ability to vary diameter and axis along the length of the fiber or filament;
3. Material-agnostic ability to vary composition along the length of the fiber or filament; and
4. Material-agnostic ability to coat specific sections of fibers or filaments with a desired material, morphology, and thickness—referred to as "SPOT COATING"—as illustrated in FIGS. 8A-E and 11.

These four axiomatic properties constitute a set of manufacturing tools that defines a brand new range of nuclear-material capable filamentary constructs, unleashing new designs, a few examples of which will now be discussed.

For instance, using embodiments described herein, there is an ability to grow filaments in a material-agnostic method or methods, meaning that the material or materials of a fiber, or filament, according to embodiments described herein, can be altered in stoichiometry, or completely changed during the growth of the fiber, or filament. For instance, High Performance Fibers (HPFs) are being proposed for expanding uses in many specialized applications, such as military and aerospace (turbo machinery, rockets, advanced structures), automobile, biomedical, energy, and other applications that require advanced materials with exceptional strength, stiffness, heat resistance, and/or chemical resistance. HPFs are sought when a combination of extreme material properties is required which cannot be met by existing metal filaments or by carbon, glass, vegetal, or mineral fibers. HPF composite systems generally include a plurality of coated fibers, distributed within a "matrix."

Figure 2:
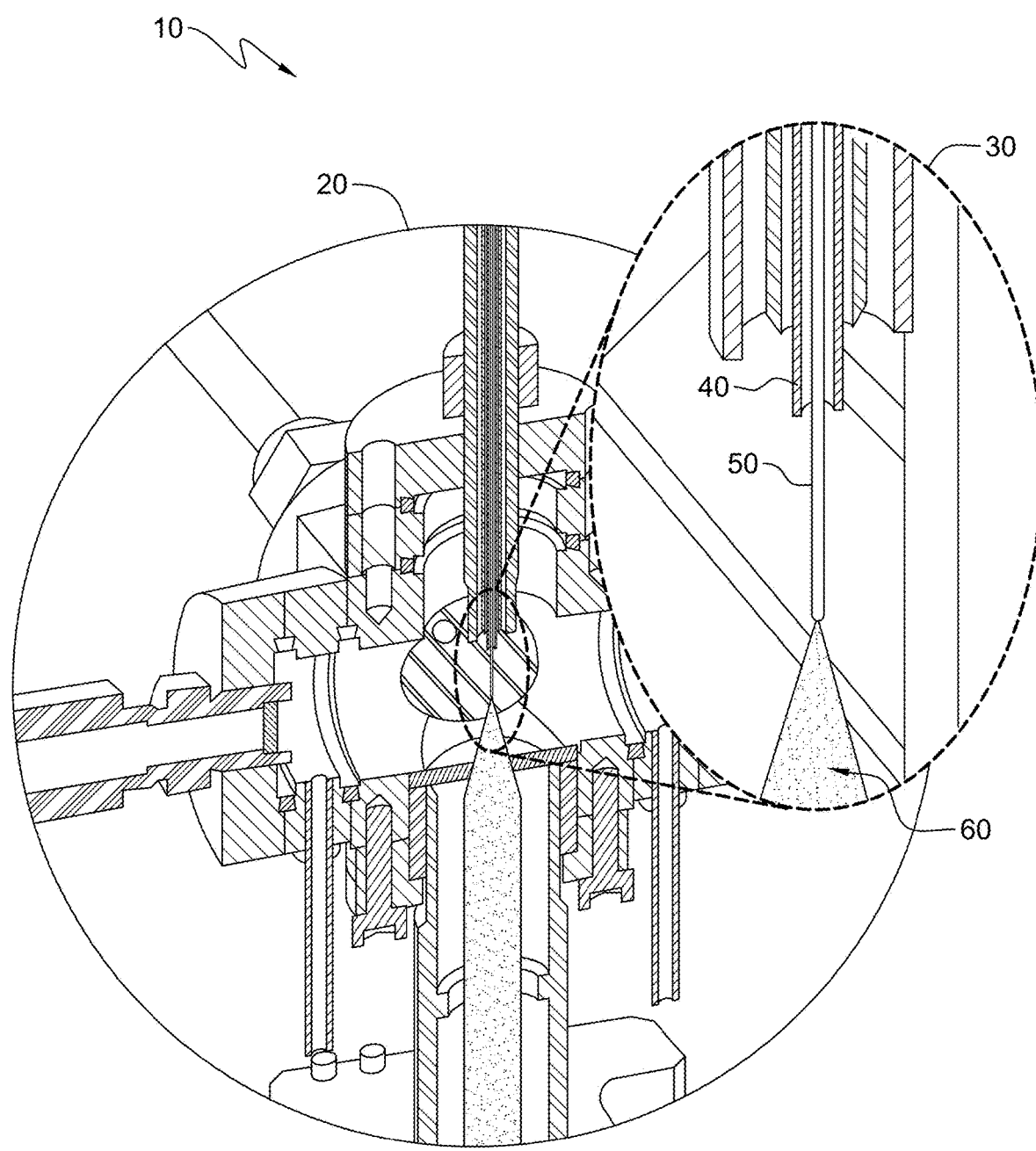
FIG. 2 is a schematic view of an exemplary process for forming a monofilament fiber.

In most cases currently, fiber formation is accomplished by passing a liquid precursor through a spinneret. For example, FIG. 1 is a schematic representation of a spinneret, a plate with a pattern of tiny holes through which a liquid precursor is fed. Upon exit, the stream pattern gels into filaments called "green fibers". This prior art, however, assumes that the fiber material can exist in either a liquid, gel, or plastic form that lends itself to flowing through a small opening. In many instances, and especially for refractory materials, such a liquid or near liquid state does not exist. The present inventors have concluded, therefore, that when a spinneret is incompatible with the fiber material properties, a better approach involves extracting fiber out of a laser focus where the fiber is created from surrounding fluid precursors, which is not possible using the spinneret of FIG. 1. A laser is focused on the fiber tip thereby heating the fiber to temperatures at which the precursors dissociate and Chemical Vapor Deposition (CVD) takes place. The fiber grows in length and is pulled out of the reaction zone at the growth rate, resulting in the creation of an arbitrarily long monofilament fiber. This process technology, according to embodiments of the current invention, is illustrated by FIG. 2. FIG. 2 is a schematic of an exemplary process as follows including a reactor 10; enlarged cutout view of reactor chamber 20; enlarged view of growth region 30. A self-seeded fiber 50 grows towards an oncoming coaxial laser 60 and is extracted through an extrusion microtube 40. CVD precursors are injected into the reaction zone from the extrusion microtube forming a small high concentration plume around the reaction zone that feeds and convectively enhances growth. This plume is embedded in a coaxial flow of inert gas that shields the reaction and carries away diluted by-products. This reactor design builds upon understanding of Laser Induced Chemical Vapor Deposition (LCVD) fiber growth. It provides a unique and valuable materials science laboratory, suited for rapid experimental development of specialty filaments. It may be, however, unfit for large scale manufacturing.

As in the microelectronics fabrication industry, where features are massively replicated using optical (photolithographic) methods, large scale replication of fiber growth is herein proposed. Pure optical parallelization for fiber growth is one approach to mass production of fibers. For example, a parallelization of the process technology illustrated by FIG. 2 can be pursued.

In pursuing large scale manufacturing objectives, however, certain features of the FIG. 2 approach should be preserved, such as:

Feature 1—Convection enhanced high-pressure precursor flow—has been shown to optimize single fiber growth.

Feature 2—Imaging at wavelengths that are specific to byproducts (e.g. Hydrogen at 656 nm)—provides for direct observability of fiber growth and has been used for process control.

Feature 3 and 4 respectively—Containerless and Material-agnostic—form the basis for a platform technology capable of processing a wide range of materials.

Figure 3:
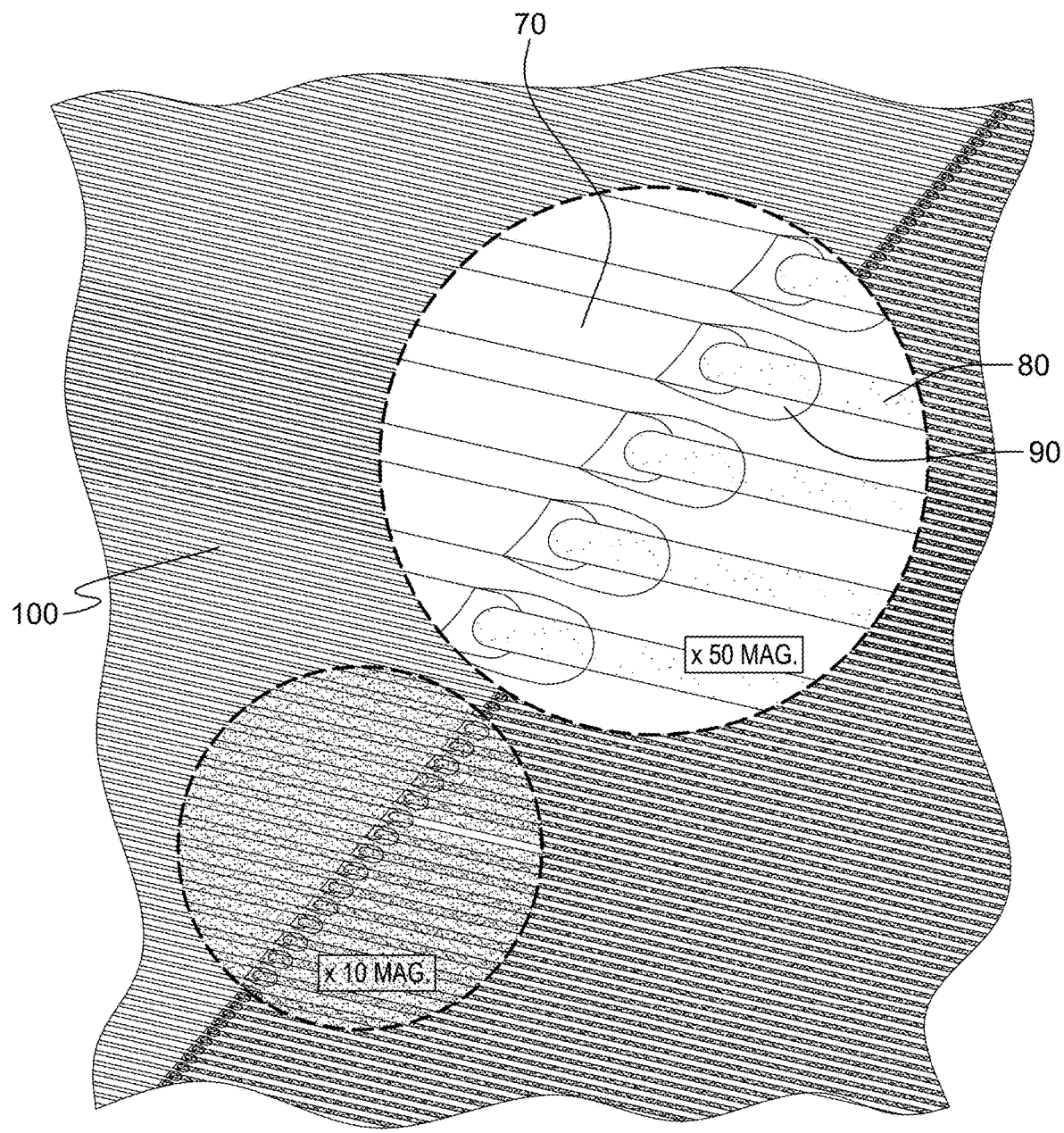
FIG. 3 is a schematic view showing how, in accordance with the present invention, fiber LCVD is massively parallelized by multiplication of the laser beams.

The present invention, in one embodiment, is the use of a large array of independently controlled lasers, growing an equally large array of fibers 80 in parallel, as illustrated in FIG. 3, showing how fiber LCVD can be massively parallelized from a filament lattice 100 by multiplication of the laser beams 80 inducing a plasma 90 around the tip of each fiber 80. In embodiments of the current invention, the large array of fibers 80 can be directed toward a substrate, growing standing fibers in a large array directly on a substrate, and controlling the environment at the tip of the laser to control the material system, and change the material system, of the fibers.

Using a Computer to Plate (CtP) (e.g., Quantum Well Intermixing (QWI)) laser array for LCVD is a scientific first, and so was the use of a shallow depth of focus. It provides very beneficial results. Sample carbon fibers, such as those shown in FIG. 4, were grown in parallel. FIG. 4 shows parallel LCVD growth of carbon fibers using a unit with multiple lasers, for instance 64 or more. Left: Fibers during growth. Right: Resulting free standing fibers 10-12 µm in diameter and about 5 mm long.

In all prior instances the beam was focused to a diffraction limited spot with long Raleigh range. In accordance with the present invention, not only is the focus intense enough to sustain CVD, but the shallow depth of field means that fibers could only grow in a small region in the front and back of the image plane. This goes against commonly accepted practice in LCVD where long depths of field are favored to maximize the growth region. The advantage of a shallow depth of field is important because of the level of control it could afford. For example, if one fiber stopped growing for any reason, the focus can be moved back to that fiber tip. All other growths would stop and then restart as the lagging fiber was pulled back to the same level as the others.

The effect of a shallow depth of focus according to some embodiments of the invention, is illustrated in FIG. 4. The uneven focus-to-focus power distribution of diffraction gratings combined with the long depth of focus of diffraction limited optics prevents any control over the position of the growth front in previous fiber arrays. A major benefit is evident in FIG. 4: Fibers are grown in unison, and to the same height. This was an unexpected benefit of source imaging over diffraction limited optics because the depth of focus is 5 to 30 times (vertical and horizontal respectively) shallower than the Rayleigh range of an equivalent diffraction limited focus. This turns out to be a huge advantage as fibers quickly grow in and out of focus. This makes it possible to track fiber growth, and even backtrack to retrieve fibers that stopped growing without affecting any of the other already grown fibers. This unique feature of the CtP laser bars is expected to represent a major advantage in controlling future parallel LCVD growth for fiber arrays.

Another advantage to fibers of a fiber structure according to one or more embodiments of the current invention is the ability to vary diameter along the length of a filament or fiber, similar to methods disclosed in U.S. Patent Publication No. 2017/0213604A1 (which is incorporated herein by reference above). Advantages of varying the diameter along the length of a fiber may be better understood, for instance, in reference to a nuclear application of said materials.

Figure 5:
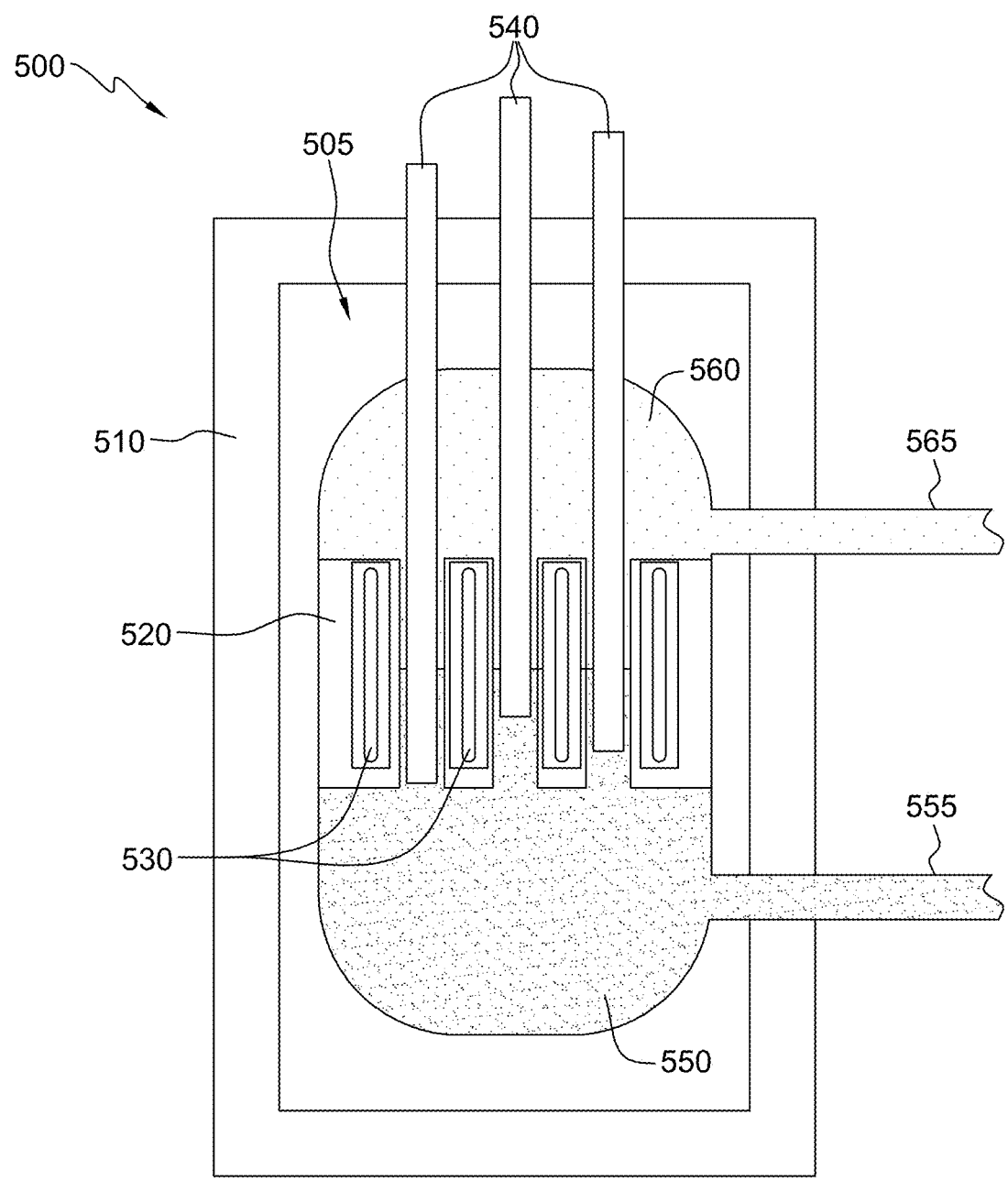
FIG. 5 depicts an exemplary layout of a nuclear reactor, illustrating generally the use of nuclear fuel structures in nuclear reactor operation.

For instance, turning to FIG. 5, illustrated is a simplified schematic of an example nuclear reactor 500, as may be part of a nuclear power plant. The nuclear reactor 500 depicted in FIG. 5 includes a reactor vessel 505 encased inside a reactor shield 510, which may be made of concrete or other material capable of withstanding high temperatures, so that material within the reactor shield 510 may be contained in the event of an accident. Reactor vessel 505 includes a core 520 in which nuclear fuel rods 530 and control rods 540 are disposed. Reactor vessel 505 also holds a coolant material 550, such as water or heavy water, which may be drawn into reactor 505 through a coolant inlet 555. Fuel rods 530 include a nuclear fuel material, frequently uranium dioxide fuel capsules, encased in a metal alloy fuel rod casing or cladding, such as a zirconium alloy metal casing. (Many nuclear fuel rods make use of zirconium alloy cladding materials produced under the trademark name Zircaloy.) The nuclear fuel material is bombarded with neutrons that can initiate a fission reaction in the nuclear fuel; the reaction splits the nucleus of the nuclear fuel material, releasing heat energy and additional neutrons that subsequently continue the fission reaction. The heat energy heats the coolant 560, which may then be pumped out of reactor vessel 505 via coolant outlet 565; the heated coolant 560 may be used, for example, to generate steam to drive turbines that in turn generate electrical energy (not depicted in FIG. 5 for simplicity). Core 520 may be made of one or more moderator materials, such as graphite, capable of slowing neutrons down to speeds at which the neutrons are more likely to react with the nuclei of the nuclear fuel material. Coolant material 550 may also act as a moderator material to slow down high-speed neutrons bombarding fuel rods 530. Control rods 540 may be used to variably control a fission rate of the nuclear fuel material in fuel rods 530. Control rods 540 may be made of one or more materials capable of absorbing neutrons without undergoing a fission reaction, such as boron, silver, cadmium, and/or indium. As control rods 540 are pulled out partially or fully from the reactor vessel 505, more neutrons may successfully bombard and react with nuclear fuel material in fuel rods 530, increasing energy output; conversely, by inserting the rods further or fully into reactor vessel 505, more neutrons may be absorbed and the nuclear fission reactions slowed to reduce energy production. In some nuclear reactors, fully inserting control rods 540 may be used to fully stop fission reactions in fuel rods 530.

Figure 6A:
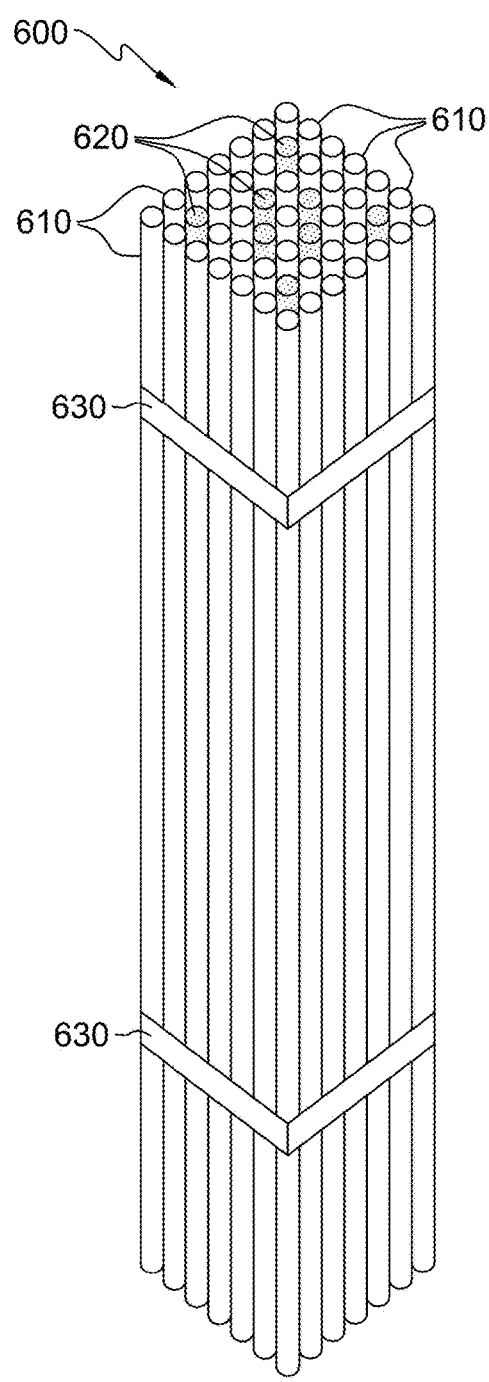
FIGS. 6A-6B depict an example structure including multiple nuclear fuel rod structures and control rod structures, illustrating one possible structure for encasing and storing nuclear fuel structures.
Figure 6B:
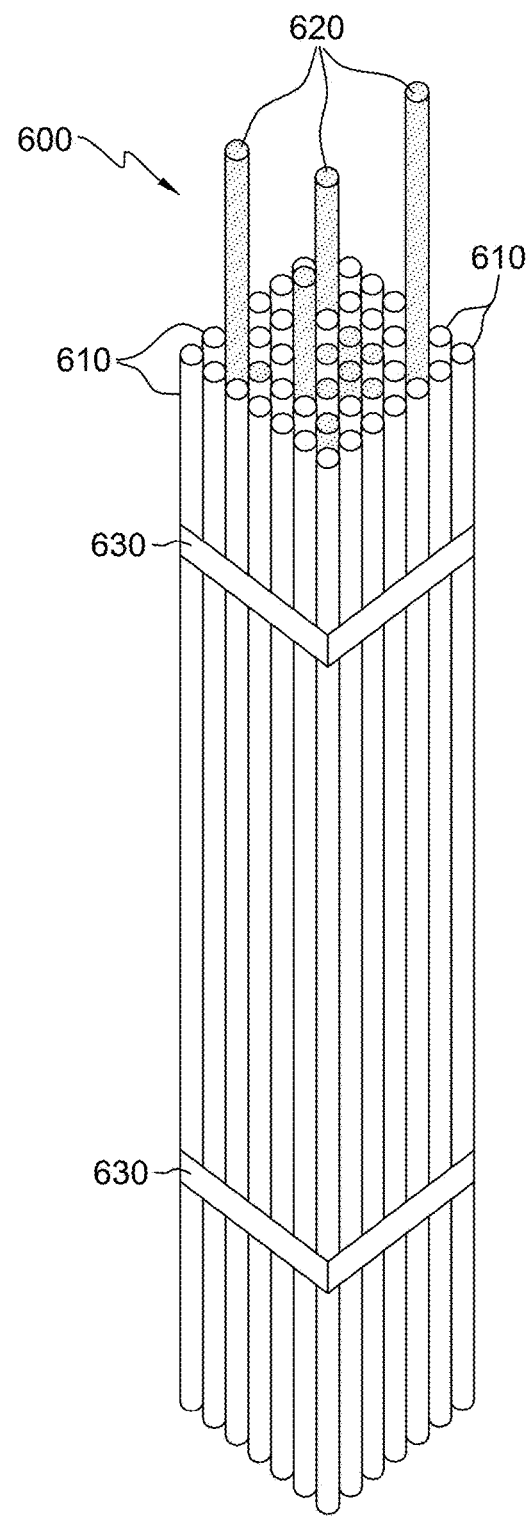

FIGS. 6A and 6B illustrate an example of a nuclear fuel assembly 600, as may be deployed in a nuclear reactor. Generally, nuclear fuel rods 630 and control rods 640, as depicted in FIG. 5, are not deployed separately in a nuclear reactor, but are more often deployed in a nuclear fuel assembly such as nuclear fuel assembly 600. Nuclear fuel rods 610 may be arrayed together with control rods 620 interspersed among the nuclear fuel rods 610, and both nuclear fuel rods 610 and control rods 620 bound by one or more spacers 630. The entire nuclear fuel assembly 600 may be deployed within a nuclear reactor vessel, such as reactor vessel 505 of FIG. 5, so that the nuclear fuel assembly is surrounded by moderator materials, such as the core 520, and coolant 550 may flow around fuel rods 610 and control rods 620. The control rods 620 may be coupled with controls within or outside the reactor vessel so that the control rods 620 may be variably withdrawn or inserted further into nuclear fuel assembly 600, as illustrated by FIG. 6B.

Referring to FIG. 5 again, it may be noted that coolant 550 may serve several purposes within nuclear reactor 500. Coolant 560, being heated by the heat generated from fission reactions, carries away heat from the fuel rods 530 and core 520, and the heat energy of coolant 560 may be converted to electrical energy. As well, coolant 550, 560 may act as a moderator to slow neutrons to speeds at which they are more likely to successfully react with nuclear fuel material. In a loss of coolant accident (LOCA), coolant levels may drop within the reactor vessel 505 so that heat energy is no longer adequately conveyed out of the reactor, allowing heat to build within the reactor and potentially damage fuel rods 530, including the casing material. Although a loss of coolant may also represent a loss of moderator material, and thus result in a slow-down of fission reactions in the nuclear fuel material, heat may still build rapidly in the reactor vessel as the radioactive nuclear fuel materials, as well as radioactive by-products of fission reactions, continue to radiate heat energy into the reactor. Both the Three Mile Island disaster and the Fukushima Daiichi disaster began as loss of coolant accidents, resulting in a meltdown and highly exothermic oxidation of the zirconium alloy cladding, producing vast amounts of hydrogen gas and resulting in further heat build-up and a subsequent core meltdown. Once the cladding of fuel rods has been breached or cracked in a meltdown, the radioactive nuclear fuel and its radioactive fission by-products may be exposed and mix with other gases produced by the meltdown, allowing the radioactive materials to escape into the surrounding environment.

Figure 7A:
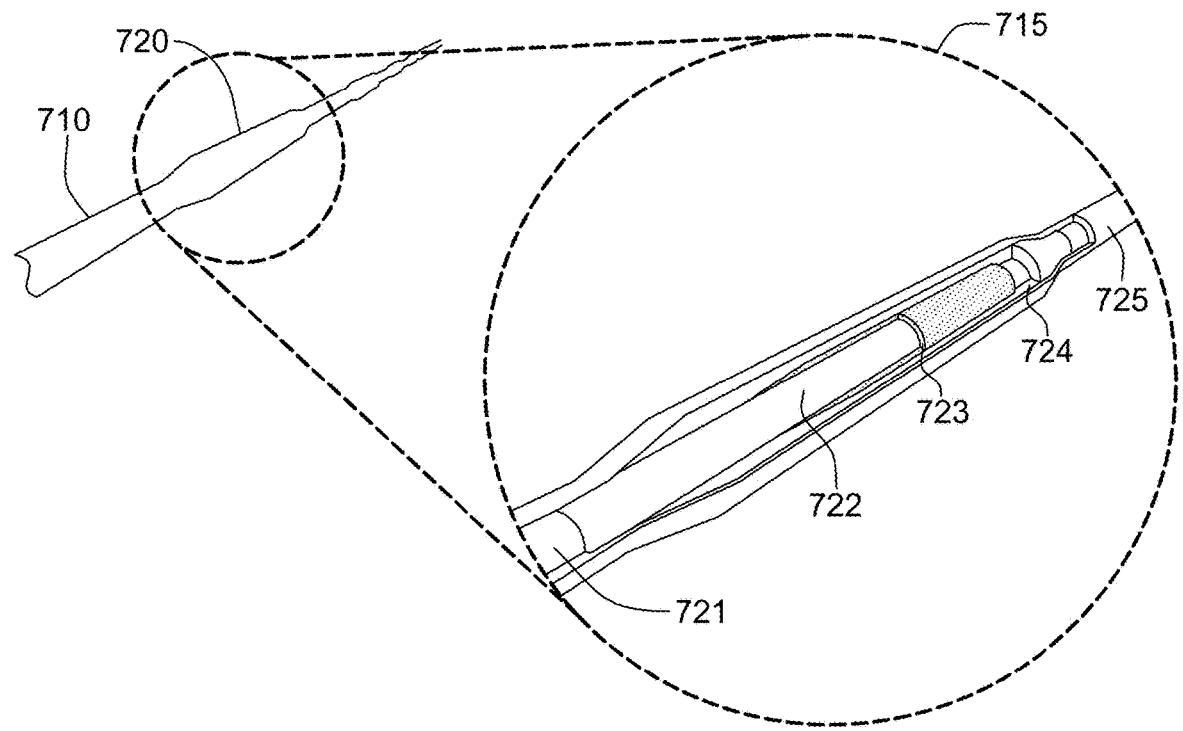
FIG. 7A depicts one embodiment of a fiber including a multilayer fuel region, in accordance with one or more aspects of the present invention.

FIG. 7A depicts one embodiment of a fiber 710 that includes a multilayer fuel region 720. A cutaway view 715 of multilayer fuel region 720 is provided to show clearly the multiple layers of multilayer fuel region 720. Multilayer fuel region 720 has an inner layer region 723 that includes nuclear fuel material, such as uranium or a uranium compound, and an outer layer region 724 that encases the nuclear fuel material of inner layer region 723. The nuclear fuel material of inner layer region 723 may be uranium dioxide ($UO_2$), as uranium dioxide may be used frequently as a nuclear fuel in many nuclear fuel structures. However, because the inner layer region 723 is completely, hermetically sealed by outer layer region 724, uranium, plutonium or fissile material-containing compounds with a higher fissile material density than that of uranium dioxide may also be used, such as uranium mononitride (UN), uranium carbide (UC), and uranium silicide ($U_2Si_3$). Outer layer region 724 may include, for example, pyrolytic carbon (PyC), and/or may include silicon carbide. In the exemplary multilayer fuel region depicted in FIG. 7A, inner layer region 723 may be considered a first inner layer region 423 and multilayer fuel region 420 may include a second inner layer region 722 disposed below the first inner layer region 723. The second inner layer region may include a material, such as nanoporous carbon, selected to capture by-products of nuclear fission reactions, such as gaseous by-products, occurring in the nuclear fuel material of inner layer region 723.

Outer layer region 724 may include, for example, pyrolytic carbon (PyC), and/or may include silicon carbide. Outer layer region 724 may, in one embodiment, be a first outer layer region 724, and multilayer fuel region 720 may include a second outer layer region. Second outer layer region may include a material that adds further functionality to fiber 710. For example, a second outer layer region may include a nuclear poison material, such as boron or gadolinium, which may delay activity of the nuclear fuel material of inner layer region 723. Second outer layer region, in another example, may include a material, such as carbon, that acts as a moderator of nuclear fission activity of the nuclear fuel material of inner layer region 723. In another example, second outer layer region may include an interphase layer for structural integration with a SiC matrix.

Multilayer fuel region 720 may be formed over a core region 721. Core region 721 may be, for example, a silicon carbide filament along a length of fiber 710, over a portion of which the multiple layers of multilayer fuel region 720 are formed. Core region 721 generally may include any ceramic material, such as silicon carbide or hafnium carbide. Finally, an overcoat layer 725 may further encase the multiple layers of multilayer fuel region 720 and core region 721. Overcoat layer 725 may itself be a multilayer overcoat. Overcoat layer 725 may include a ceramic material, such as silicon carbide or hafnium carbide, and may include additional overcoat layers that further functionalize the fiber. For example, an additional layer may be a layer of pyrolytic carbon (PyC) applied as a CMC interphase layer. In another example, an additional layer may include boron nitride applied to serve both as an interphase layer and a burnable nuclear poison layer to inhibit nuclear fission reactions in nuclear fuel material 723. Multilayer fuel region 720 may be one multilayer fuel region of a plurality of discrete multilayer fuel regions 720 disposed along fiber 710, as illustrated in FIG. 7A. Each discrete multilayer fuel region 720 may have a respective inner layer region 723 made of the nuclear fuel material, and a respective outer layer region 724 encasing the nuclear fuel material. The plurality of discrete multilayer fuel regions may be disposed over core region 721 along the length of the at least one fiber 710. Overcoat layer 725 may encase the plurality of discrete multilayer fuel regions 720 and core filament 721, resulting in a completed fiber 710. Overcoat layer 725, as depicted in FIG. 7A, may have a substantially uniform thickness along the length of fiber 710. As illustrated by FIG. 7A, the plurality of discrete multilayer fuel regions 720 appear as "beads" disposed along fiber 710, as the plurality of discrete multilayer fuel regions have a greater thickness than regions of fiber 710 including core filament 721 and overcoat 725 without a multilayer fuel region.

Figure 7B:
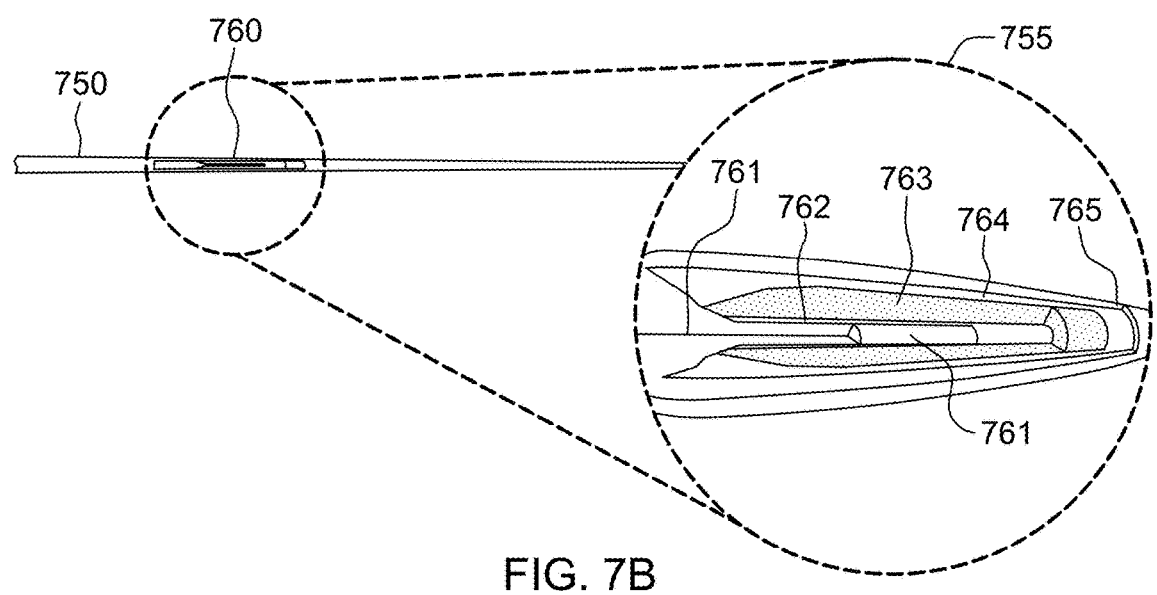
FIG. 7B depicts another embodiment of a fiber including a multilayer fuel region, in accordance with one or more aspects of the present invention.

FIG. 7B depicts an alternative embodiment of a fiber 750 that includes a multilayer fuel region 760, in which the fiber 750 has a substantially uniform thickness, so that multilayer fuel region 760 appears to be embedded within fiber 750. In the alternative embodiment of FIG. 7B, first inner layer region 763, second inner layer region 762, outer layer region 764, and overcoat 765 may have varying thicknesses over a length of multilayer fuel region 760, with a thickness of a layer tapering at either end of multilayer fuel region 760. In one exemplary embodiment, core region 761 may be provided to have a variable thickness prior to providing the layers of multilayer fuel region 760. In another exemplary embodiment, core region 761 may have a substantially uniform thickness, and multilayer fuel region 760 may be formed over core region 761 and may initially have a beaded appearance as depicted in FIG. 7A, but overcoat layer 765 may be provided with a variable thickness over multilayer fuel region 760 and core region 761, resulting in fiber 750 having a substantially uniform thickness along a length of fiber 750.

The exemplary embodiments of fibers 710 and 750, as depicted in FIGS. 7A and 7B, are only two possible embodiments of a fiber including a multilayer fuel region 720, 760, and including a plurality of discrete multilayer fuel regions 720, 760. Variations of the examples depicted, as well as alternative multilayer fuel region embodiments, may be possible and contemplated within the scope of the disclosure herein. For example, fibers such as fibers 710/750 may have other functionality added by either or both of coating or doping. Specifically, fibers may embed materials intended to either enhance or inhibit nuclear fission reactions, either temporarily or permanently. In one example, fibers can be coated or doped with materials intended to enhance nuclear reaction, which transmute into isotopes that are themselves fissionable. Examples of such isotopes are Thorium-232 and Uranium-238. In another example, fibers can be coated or doped with neutron-absorbing isotopes that inhibit nuclear reactions. Among such isotopes—known as "nuclear poisons"—are temporary inhibitors called "burnable poisons", such as boron and gadolinium. Other elements are long-term inhibitors, such as hafnium. In one example, dopant may be added to a fiber or fibers during fabrication, and become part of a microstructure of the fiber, either as interstitial elements, substitution elements, or concentrated at grain boundaries. In yet another example, functional coatings can be coated locally over the entire length of a fiber. A coating can also be applied to the fibers in compound form, where the coating can serve to meet additional functional requirements. For example, boron can be added in the form of boron nitride, which can also serve as a lubricant interphase in a ceramic matrix composite. Boron can also be added as boron carbide. Similarly, hafnium can be coated as hafnium carbide and serve as a high-temperature environmental barrier. Without any loss of generality, any references herein to a fiber 410 and/or multilayer fuel region 420, as depicted in FIG. 7A, may also be considered to be applicable to a fiber 450 and/or multilayer fuel region 760, as depicted in FIG. 7B, and vice versa.

Figure 7C:
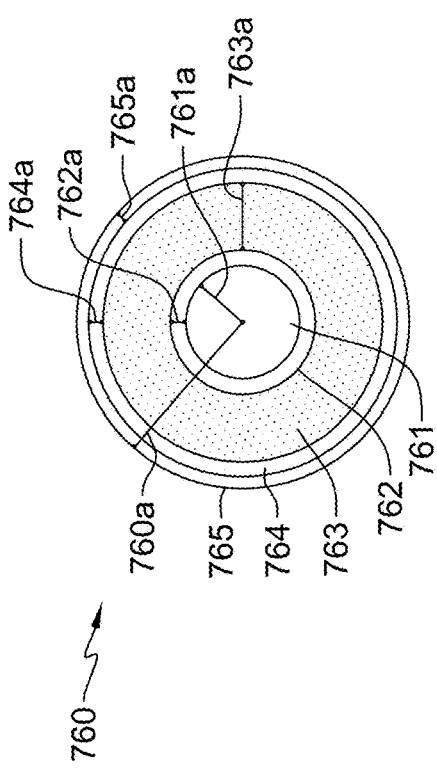
FIG. 7C depicts a cross-section view of a fiber including a multilayer fuel region, in accordance with one or more aspects of the present invention.

FIG. 7C depicts a radial cross-section view through multilayer fuel region 760 of fiber 750 of FIG. 7B, illustrating exemplary thicknesses of the different layers of multilayer fuel region 760. A similar cross-section view and exemplary thicknesses may apply to multilayer fuel region 720 of FIG. 7A. Core region 761 may be a ceramic material filament, such as a silicon carbide filament, with a thickness 761a in a range of about 5 μm to about 10 μm measured radially from the center of core region 761 (resulting in core region 761 having a diameter ranging from about 10 μm to about 20 μm). First inner layer region 763, having the nuclear fuel material, may have a thickness 763a ranging from about 3 μm to about 30 μm or more. Second inner layer region 762, disposed between the nuclear fuel material 763 and the core region 761, may have a thickness 762a ranging from about 0.5 μm to about 1.5 μm or more. Outer layer region 724, encasing the nuclear fuel material of first inner layer region 763, may have a thickness 764a ranging from about 1 μm to about 2 μm. Overcoat layer 765 over multilayer fuel region 760 may have a thickness ranging from about 1 μm to about 2 μm or more, if desired. Overcoat layer 765 may have a similar thickness over portions of fiber 750 that do not have a multilayer fuel region (i.e., portions of the fiber 750 that include portions of core region 761 and overcoat layer 765 applied over core region 761), or may have a greater thickness over such portions of fiber 750. Multilayer fuel region 760 may thus have an overall thickness 460a ranging from about 10 μm to about 22 μm or more, depending on the thicknesses selected for the layers of multilayer fuel region 760, as measured radially from the center of core region 761 to the outer surface of overcoat layer 765.

Figure 7D:
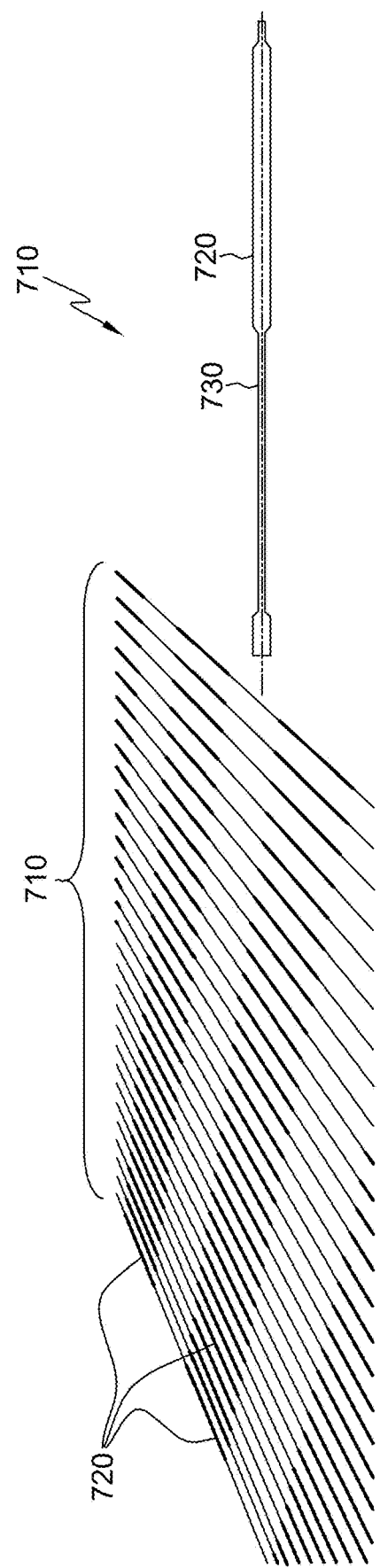
FIG. 7D illustrates one embodiment of a plurality of fibers including a plurality of discrete multilayer fuel regions, or a plurality of scaffolding fibers thereof, in accordance with one or more aspects of the present invention.
Figure 10:
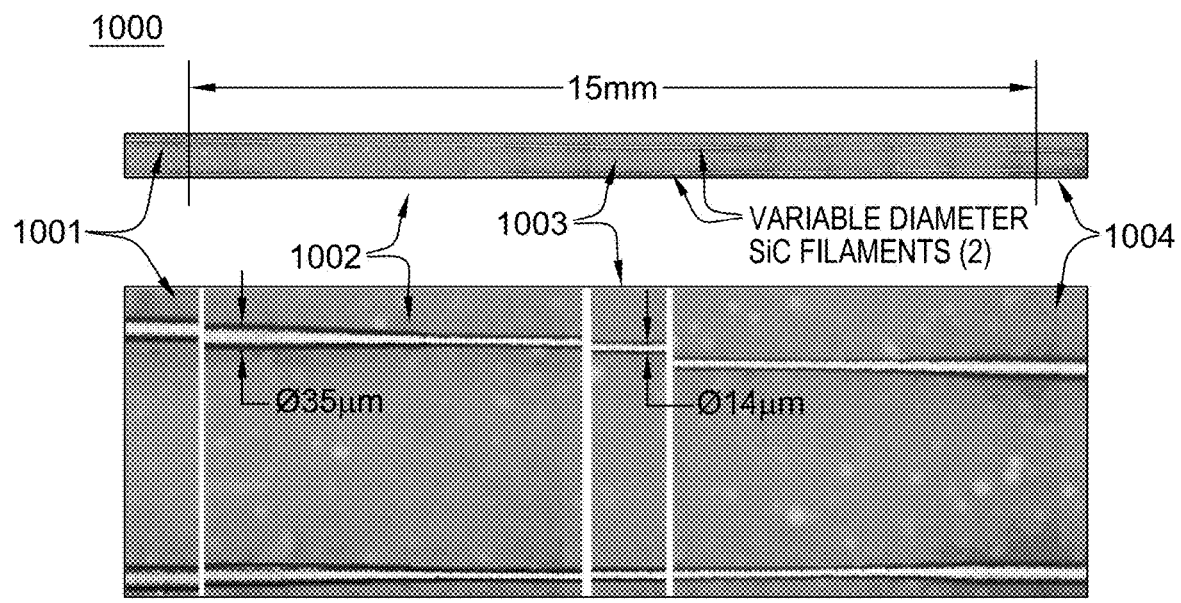
FIG. 10 depicts one embodiment of a plurality of scaffolding fibers that may be formed by a digital spinneret technology, in accordance with one or more aspects of the present invention.
Figure 11:
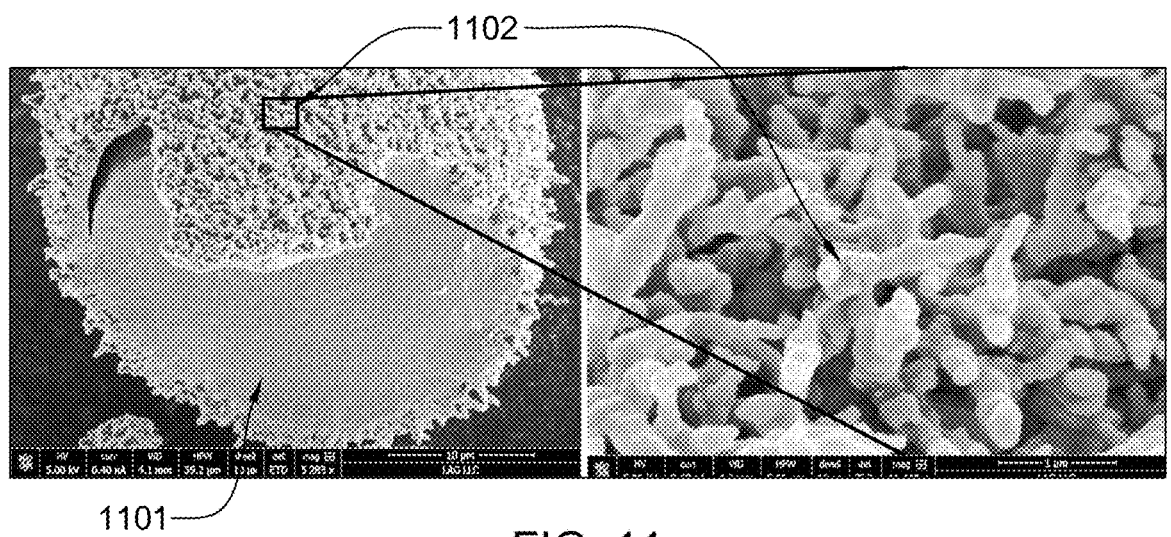
FIG. 11 depicts one embodiment of a nanoporous carbon layer, in accordance with one or more aspects of the present invention.

FIG. 7D may illustrate one embodiment of a portion of multiple fibers 710, for example multiple scaffold fibers 710 as illustrated, for example, in FIG. 10, and may also illustrate multiple fibers 710 including pluralities of discrete multilayer fuel regions 720, arrayed to form a ribbon or tow that may be wrapped around an inner rod structure of a nuclear fuel structure. For clarity the fiber 710 and multilayer fuel region 720 illustrated in FIG. 7A is shown in FIG. 7D to illustrate clearly the plurality of discrete multilayer fuel regions 720 disposed along fibers 710, with the plurality of discrete multilayer fuel regions 720 separated by non-fuel portions 730 of fibers 710 that do not contain multilayer fuel regions, although it is to be understood that multiple fibers 750 as illustrated in FIG. 7B may similarly be arrayed in a similar ribbon or tow. In exemplary embodiments in which the plurality of discrete multilayer fuel regions 720 are disposed substantially uniformly over a length of fiber 710, any one of the plurality of discrete multilayer fuel regions 720 may, for example, be about 5 mm long, and any one non-fuel portion 730 may, for example, be about 5 mm long. The plurality of discrete multilayer fuel regions 720 may thus cover about half or 50% of an overall length of one fiber of the multiple fibers 710. The length dimensions provided are by way of example only, as the plurality of discrete multilayer fuel regions may be formed to have greater or smaller lengths, and may be separated by larger or smaller non-fuel portions 730 along fiber 710. For example, multilayer fuel regions 720 may be formed to a length of about 6.5 mm, and the non-fuel portions 730 separating the plurality of discrete multilayer fuel regions 720 may be about 3.5 mm in length. In this example, the plurality of discrete multilayer fuel regions 720 may cover about 65% or more of a length of fiber 710.

According to embodiments of the current invention, multi-layer fibers as depicted in FIGS. 7A-7D can be formed, at least in part, due to the material agnostic abilities of 1½D-printing, in some embodiments utilizing LCVD. The processes utilized are described below in FIGS. 8A-8E, and can be utilized in an array on a substrate to grow one or more sets of different fibers. For instance, the different types of rods necessary for fuel applications could be grown upon the same substrate.

Figure 8A:
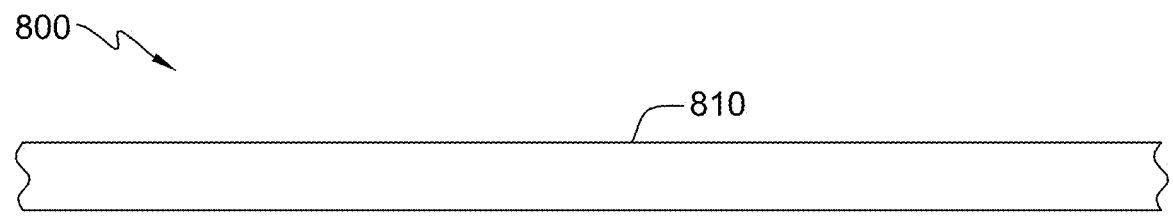
FIGS. 8A-8E depict a process for facilitating fabricating a fiber with a multilayer fuel region, in accordance with one or more aspects of the present invention.

FIGS. 8A-8E depict one example of a part of a process for forming a nuclear fuel structure, including forming a multilayer fuel region within at least one fiber of a plurality of fibers, which can be incorporated onto a substrate, and in some embodiments, grown on a substrate. The substrate may include any solid material, including but not limited to a wafer, a substrate material, and a plurality of fibers fabricated already using, for instance, any of the embodiments of the current invention. The process depicted in FIGS. 8A-8E may be described as forming a multilayer fuel region by spot-coating, or depositing a layer of material of a specified thickness over a given length of the at least one fiber. FIG. 8A depicts a portion of a fiber 800 including a core filament 810. Core filament 810 may be a core region, as described above, and may include a ceramic material such as silicon carbide or hafnium carbide. In the example depicted in FIG. 8A, core filament 810 may have a substantially uniform thickness.

Figure 8B:
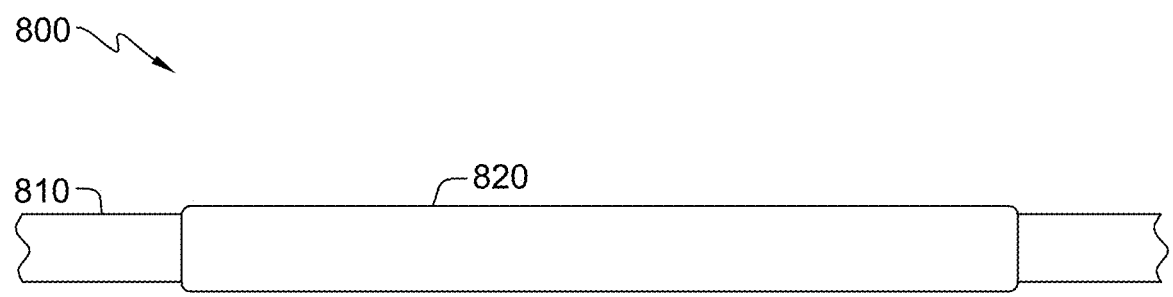

FIG. 8B depicts core filament 810 of FIG. 8A having a material layer 820 deposited over a portion of core filament 810, where material layer 820 includes a material selected to absorb gaseous by-products of nuclear fission reactions occurring in a nuclear fuel material. Material layer 820 may correspond to a second inner layer region 722 depicted in the example of FIG. 7A. In exemplary embodiments material layer 820 may include nanoporous carbon. A material layer 820 of nanoporous carbon may be provided, for example, by chlorine etching of a part of core filament 810. Alternatively, a material layer 820 of nanoporous carbon may be spot-coated onto core filament 810.

Figure 8C:
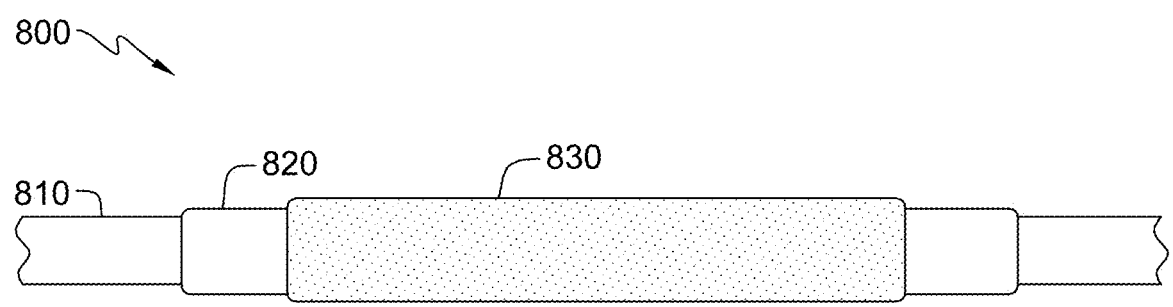

FIG. 8C depicts fiber 800 of FIG. 8B with a nuclear fuel material 830 deposited over at least a part of a length of material layer 820. Nuclear fuel material may include one or more fissile materials such as uranium, plutonium and/or related compounds, for example uranium dioxide, uranium mononitride, uranium carbide, and/or uranium silicide. Nuclear fuel material 830 may be provided, for example, by an LCVD process using, for example, uranium hexafluoride ($UF_6$) as a precursor for forming the nuclear fuel material layer. Alternatively, uranium hexafluoride ($UF_6$) may be used as a precursor for LCVD along with appropriate precursors such as ammonia, methane or chorosilane for the formation of a UN, UC or $U_2Si_3$ layer 830. Nuclear fuel material 830 in FIG. 8C may correspond to a first inner layer region 723 of FIG. 7A.

Figure 8D:
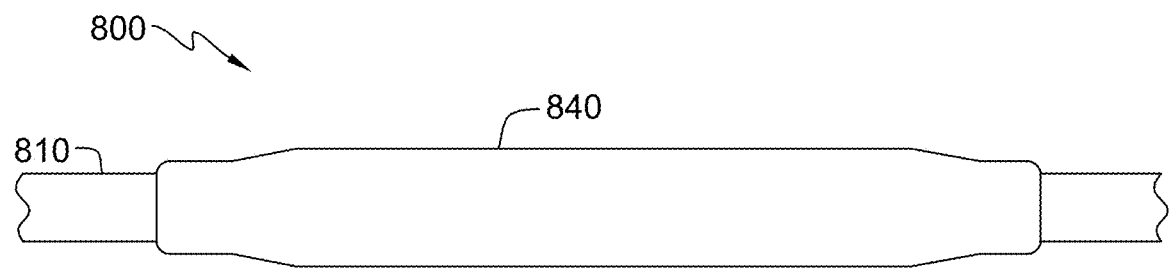

FIG. 8D depicts fiber 800 of FIG. 8C with an outer layer region 840 deposited over nuclear fuel material 830 and material layer 820 of FIG. 7C. In exemplary embodiments, outer layer region 840 encases nuclear fuel material 830 to seal the nuclear fuel within fiber 800. Outer layer region 840 may include, for example, pyrolytic carbon deposited by, in one instance, an LCVD process. Outer layer region 840 and inner layer region 830 including the nuclear fuel material, at least, form a multilayer fuel region of fiber 800.

In one embodiment, outer layer region 840 may be a first outer layer region 840, and a second outer layer region may be included. Second outer layer region may be added to add further functionality to fiber 800. For example, a second outer layer region may include a nuclear poison material, such as boron or gadolinium that may delay activity of the nuclear fuel material of inner layer region 830. Second outer layer region, in another example, may include a material, such as carbon, that acts as a moderator of nuclear fission activity of the nuclear fuel material 830. In another example, second outer layer region may include an interphase layer for structural integration with a SiC matrix.

Figure 8E:
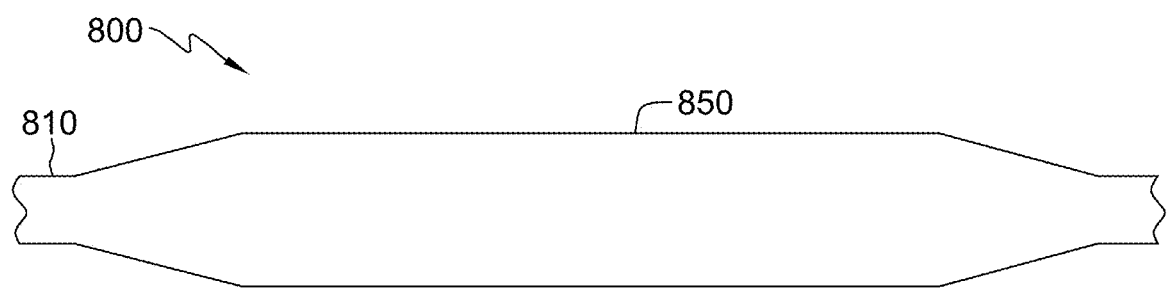

FIG. 8E depicts fiber 800 of FIG. 8D with an overcoat layer 850 deposited over fiber 800, covering both core filament 810 and the multilayer fuel region. Overcoat layer 850 may be provided, for example, by an LCVD process. In the example embodiment illustrated by FIG. 8E, overcoat layer 850 may have a substantially uniform thickness over fiber 800, resulting in the multilayer fuel region having a "beaded" appearance, as shown. In an alternative embodiment, overcoat layer may be formed to have a variable thickness over fiber 800, which may result in greater deposition of overcoat layer 850 over core filament 810 and lesser deposition of overcoat layer 850 over the multilayer fuel region. In such an alternative embodiment, the resulting fiber 800 may have a uniform appearance, as depicted in FIG. 9E.

Figure 9A:
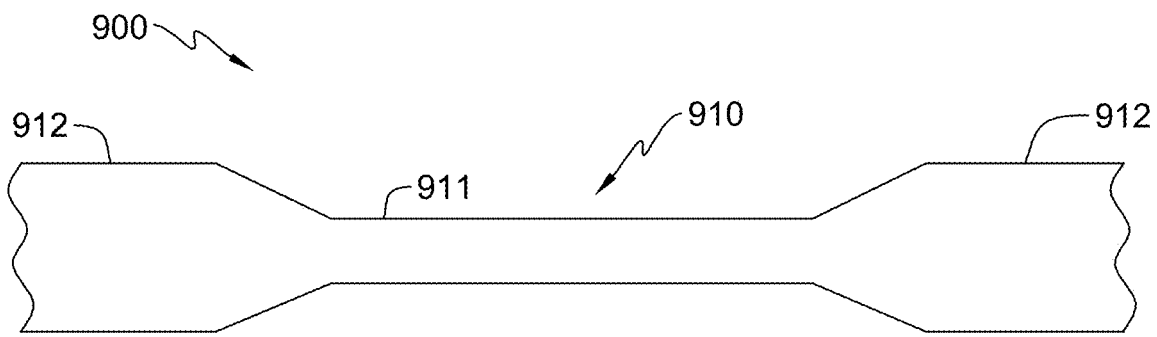
FIGS. 9A-9E depict another process for facilitating fabricating a fiber with a multilayer fuel region, in accordance with one or more aspects of the present invention.
Figure 9B:
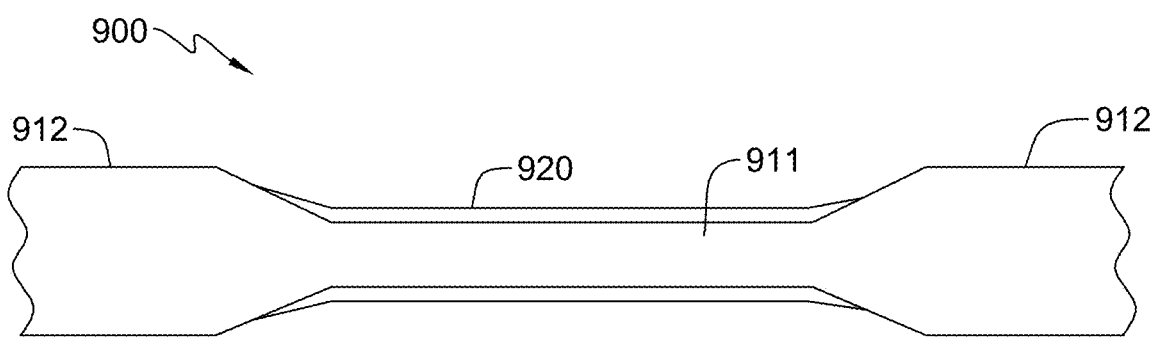
Figure 9C:
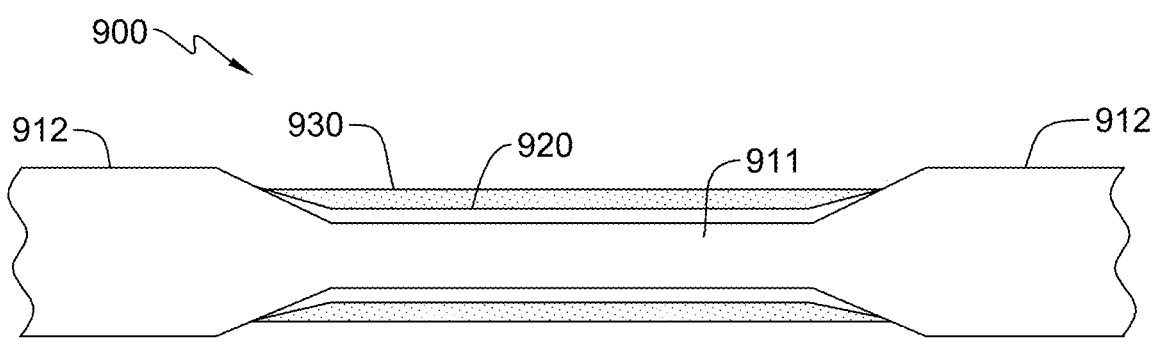
Figure 9D:
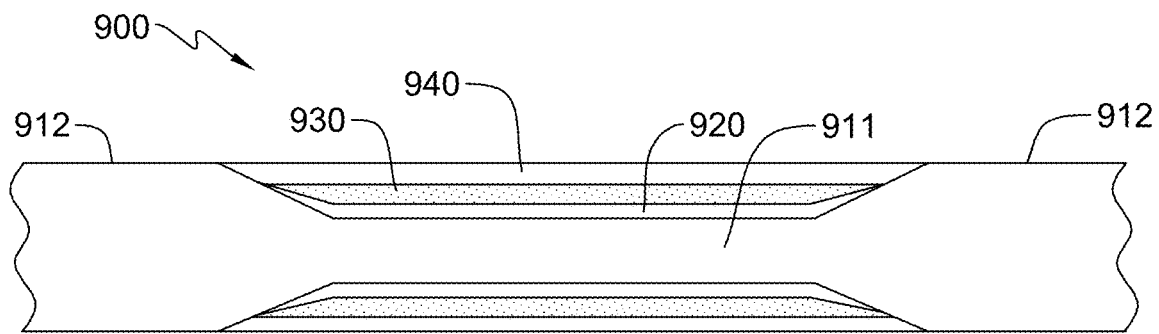
Figure 9E:
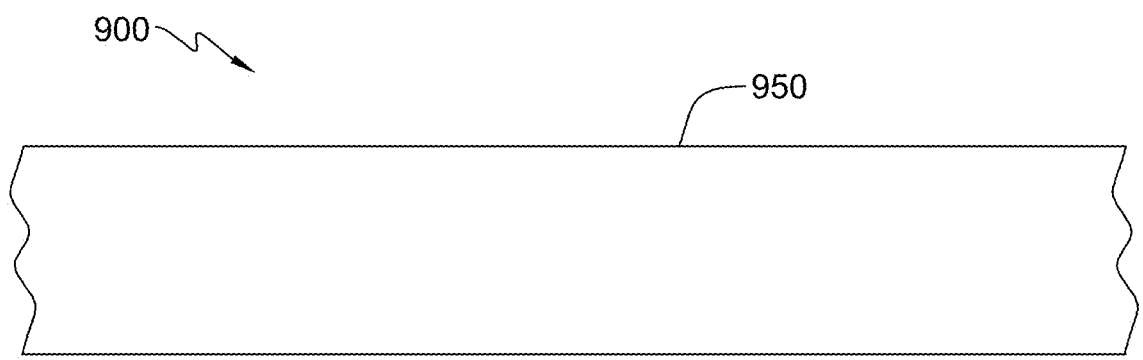

FIGS. 9A-9E depict an alternative embodiment of the process illustrated by FIGS. 8A-8E, in which core filament 910 of fiber 900, as shown in FIG. 9A, has a variable thickness over a length of fiber 900. For example, core filament 910 may have a smaller thickness over first portions 911 of core filament 910, and greater thickness 912 over second portions 912 of core filament 910. As illustrated in FIGS. 9B-9E, the layers of a multilayer fuel region may be formed over first portions 911 so that the multilayer fuel region, as finally formed, has a thickness substantially equal to the thickness of second portions 912.

FIG. 9B depicts core filament 910 of FIG. 9A having a material layer 920 deposited over first portion 911 of core filament 910, where material layer 920 includes a material selected to absorb by-products of nuclear fission reactions occurring in a nuclear fuel material. Material layer 920 may correspond to second inner layer region 762 as depicted in the example of FIG. 7B. In exemplary embodiments material layer 920 may include nanoporous carbon. A material layer 920 of nanoporous carbon may be provided, for example, by chlorine etching of a part of core filament 910. Alternatively, a material layer 920 of nanoporous carbon may be provided by spot-coating.

FIG. 9C depicts fiber 900 of FIG. 9B with a nuclear fuel material 930 deposited over material layer 920. Nuclear fuel material may include one or more fissile materials such as uranium, plutonium and/or related compounds, for example uranium dioxide, uranium mononitride, uranium carbide, and/or uranium silicide. Nuclear fuel material 930 may be provided, for example, by an LCVD process. Nuclear fuel material 930 may be provided by an LCVD process using, for example, uranium hexafluoride ($UF_6$) as a precursor for forming the nuclear fuel material layer. Alternatively, uranium hexafluoride ($UF_6$) may be used as a precursor for LCVD along with appropriate precursors such as ammonia, methane or chorosilane for the formation of a UN, UC or $U_2Si_3$ layer 930. Nuclear fuel material 930 of FIG. 7C may correspond to inner layer region 763 of FIG. 7B.

FIG. 9D depicts fiber 900 of FIG. 9C with an outer layer region 940 deposited over nuclear fuel material 930 and material layer 920 of FIG. 9C. In exemplary embodiments, outer layer region 940 encases nuclear fuel material 930 to seal the nuclear fuel within fiber 900. Outer layer region may include, for example, pyrolytic carbon deposited by, in one instance, an LCVD process. Outer layer region 940 and inner layer region 930 including the nuclear fuel material, at least, form a multilayer fuel region of fiber 900. Multilayer fuel region of fiber 900 may now have a thickness substantially equal to the thickness of second portions 912 of core filament 910.

In one embodiment, outer layer region 940 may be a first outer layer region 940, and a second outer layer region may be included. Second outer layer region may be added to add further functionality to fiber 900. For example, a second outer layer region may include a nuclear poison material, such as boron or gadolinium that may delay activity of the nuclear fuel material of inner layer region 930. Second outer layer region, in another example, may include a material, such as carbon, that acts as a moderator of nuclear fission activity of the nuclear fuel material 930. In another example, second outer layer region may include an interphase layer for structural integration with a SiC matrix.

FIG. 9E depicts fiber 900 of FIG. 9D with an overcoat layer 950 deposited over fiber 900, covering both core filament 910 and the multilayer fuel region. Overcoat layer 950 may be provided, for example, by an LCVD process. The resulting fiber 900 may have a substantially uniform thickness over a length of fiber 900 following provision of overcoat layer 950. Multilayer fuel region of fiber 900 may thus be embedded within fiber 900.

The embodiments of the processes depicted in FIGS. 8A-8E and FIGS. 9A-9E may not only be applied to one fiber, but may be applied to multiple fibers arrayed together in a ribbon or tow-like structure, so that each layer of a multilayer fuel region for one fiber is also formed over the other multiple fibers, and in embodiments, in fibers arranged in an array which have been grown on a substrate. Each step of layer formation may be carried out in a separate deposition tool. The multiple fibers may be conveyed from one deposition tool to the next for the next layer to be deposited. As well, the deposition tool or tools may be controlled to automatically stop and start deposition of layers over the multiple fibers, thus allowing for a plurality of discrete multilayer fuel regions to be formed along the lengths of the multiple fibers while also automatically forming non-fuel regions of the fiber that separate the plurality of discrete multilayer fuel regions.

While described in certain examples in the figures above, any of these coatings and multi-layer processes can be combined in any manner depending on the use of the fibers formed. Any combination of the above features can be used in embodiments described herein for forming arrays of one or more sets of fibers on the same substrate.

FIG. 10 depicts an exemplary embodiment of a plurality of filaments, for instance a plurality of fibers on a substrate. The filament section 1001 produced at the highest level of laser power has the largest thickness. As laser power decreases smoothly over the section of filament 1002, ending with section 1003. As laser power increases back up, so does filament thickness until it maxes out in section 1004.

In another embodiment, the inner layer region having the nuclear fuel material may be a first inner region, and the structure may also include a second inner layer region below the first inner layer region. The second inner layer region may include a material selected to capture by-products, such as gaseous by-products, of nuclear fission reactions occurring in the nuclear fuel material. As exemplified in FIG. 11, the material of the second inner layer region 1102 may be, in one example, nanoporous carbon deposited upon a scaffold filament 1101.

U.S. Patent Publication No. 2017/0213604A1 (which is incorporated herein by reference above) teaches but one instance of the nuclear fuel structures feasible using the proposed AM process. Other examples are discussed here that build upon the same 1½-D Printing principles without loss of generality. Some even do not require fibers to be indefinitely long, an aspect to explore further below. In fact, feasible filamentary structures are not limited to nuclear fuel. U.S. Patent Publication No. 2017/0326838 A1 (which is incorporated herein by reference above) teaches how this approach can be applied to various sensor and actuator systems micro-embedded within fibers and built using the exact same 1½-D Printing AM methodology. Some of those could certainly be used in future applications for the purpose of characterization, interrogation, and health monitoring of nuclear fuels. Any of the described sensors, actuators, and other microsystems may be embedded in fibers on a substrate, and in some instances, in arrays thereof, according to embodiments disclosed herein. Different features may be embedded in single fibers, or in sets of fibers, grown in arrays. As discussed in U.S. Patent Publication No. 2017/0326838 A1, such embedded microsystems can be, without loss of generality, sensors such as thermocouples or strain sensors, actuators such as piezoelectric actuators, microelectronics, antennas, and other microsystems.

Figure 12:
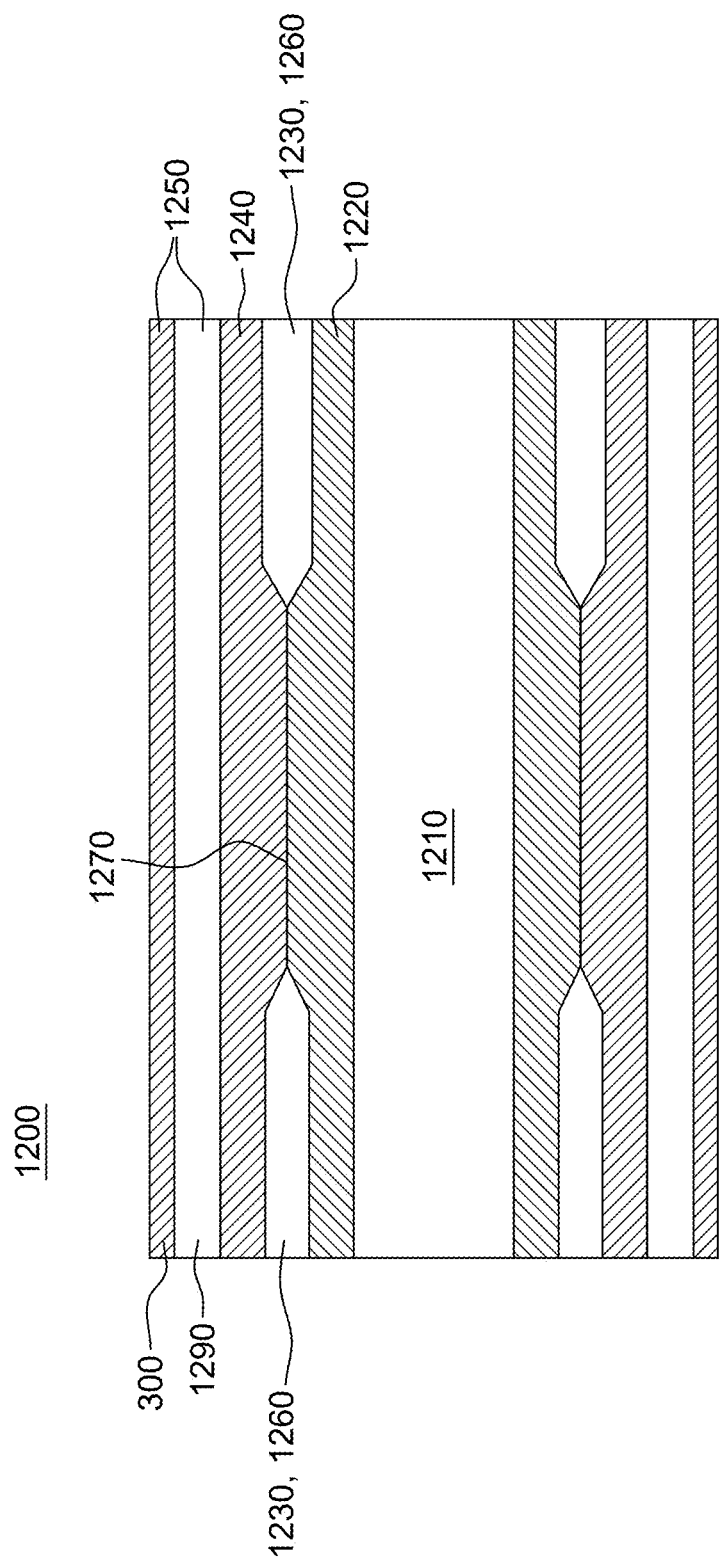
FIG. 12 illustrates in cross-sectional elevational view one embodiment of a multilayer functional fiber, in accordance with one embodiment of the present invention.

For instance, in accordance with one embodiment of the present invention, FIG. 12 illustrates a multilayer functional fiber 1200 produced by a method which includes, for instance, providing a scaffold fiber 1210, disposing a first functional layer—in this instance an electrode —1220 enclosing scaffold fiber 1210, disposing a functional layer 1230 enclosing first electrode layer 1220, disposing a second functional layer in this instance an electrode 1240 enclosing functional layer 1230, and disposing a cladding layer 1250 enclosing second electrode layer 1240. In one or more implementations, functional layer 1230 has a functional characteristic varying as a function of longitudinal position along functional layer 1230. Examples of the functional characteristic include, without limitation, the thickness of the layer and the electrostriction of the layer material.

In one or more embodiments of multilayer functional fiber 1200 of FIG. 12, functional layer 1230 comprises an insulating region 1260, wherein first electrode layer 1220 is electrically isolated from second electrode layer 1240, and a thermocouple junction region 1270, wherein first electrode layer 1220 is electrically coupled to second electrode layer 1240, and first electrode layer 1220 and second electrode layer 1240 are made of different materials. In such embodiments, when coupled to suitable electrical and electronic circuitry, the Seebeck effect may be exploited to sense temperature in the neighborhood of thermocouple junction region 1270. When coupled to different electrical and electronic circuitry, the Peltier effect may be exploited to actuate a heat transfer in the neighborhood of thermocouple junction region 1270.

In one or more other embodiments of multilayer functional fiber 1200 of FIG. 12, first electrode layer 1220 comprises tungsten and second electrode layer 1240 comprises rhenium to form a high-temperature thermocouple pair. In another embodiment, insulating region 1260 comprises amorphous boron nitride. In yet another embodiment, insulating region 1260 comprises lanthanum-modified lead zirconate titanate (PZT) as a layer of piezoelectric material. As should be clear to one of skill in the art, the multilayer functional fiber 1200 may be part of an array of tens, hundreds, or thousands of such fibers grown on a substrate.

Figure 13:
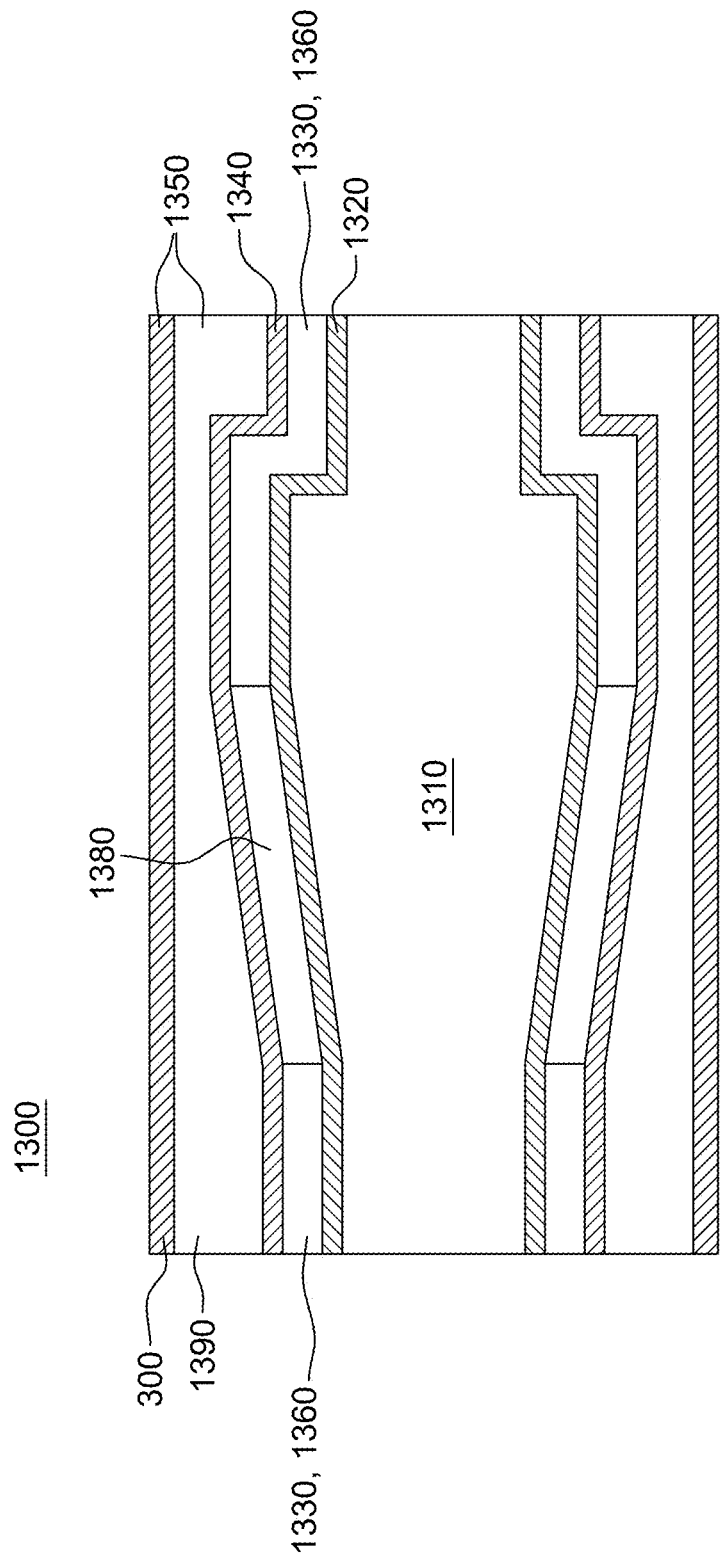
FIG. 13 illustrates in cross-sectional elevational view another embodiment of a multilayer functional fiber, in accordance with an alternative embodiment of the present invention.

In accordance with one or more other implementations of the present invention, FIG. 13 illustrates multilayer functional fiber 1300 wherein functional layer 1330 comprises an insulating region 1360—wherein first electrode layer 1320 is electrically isolated from second electrode layer 1340—and an electrostrictive region 1380, electrically coupled to first electrode layer 1320 and second electrode layer 1340. Electrostrictive region 1380 comprises a material exhibiting substantially higher electrostriction than the material of insulating region 1360. In this embodiment, when coupled to suitable electrical and electronic circuitry, the piezoelectric effect may be exploited to sense mechanical deformation (for example, strain or sound waves) in the neighborhood of electrostrictive region 1380. When coupled to different electrical and electronic circuitry, the piezoelectric effect may be exploited to actuate a force in the neighborhood of electrostrictive region 1380.

In one or more other embodiments of multilayer functional fiber 1300 of FIG. 13, insulating region 1360 comprises amorphous boron nitride. In another more detailed embodiment, electrostrictive region 1380 has a conical taper. In yet another more detailed embodiment, electrostrictive region 1380 comprises lead zirconate titanate.

In one or more alternate embodiments, the multilayer functional fiber of either FIG. 12 or FIG. 13, may include a scaffold fiber 1210 and 1310, respectively, and an overcoat layer 300 which comprise an ordinarily solid material selected from a group consisting of boron, carbon, aluminum, silicon, titanium, zirconium, niobium, molybdenum, hafnium, tantalum, tungsten, rhenium, osmium, nitrogen, oxygen, and combinations thereof. As used herein, an "ordinarily solid material" means a material that is solid at a temperature of 20° Celsius and a pressure of 1 atmosphere.

In one or more further embodiments of FIGS. 12 and 13, cladding layer 1250 (resp. 1350) may include an interphase layer 1290 (1390) and an overcoat layer 300 enclosing interphase layer 1290 (1390). In yet another more detailed embodiment, interphase layer 1290 (1390) may include hexagonal boron nitride.

Figure 14:
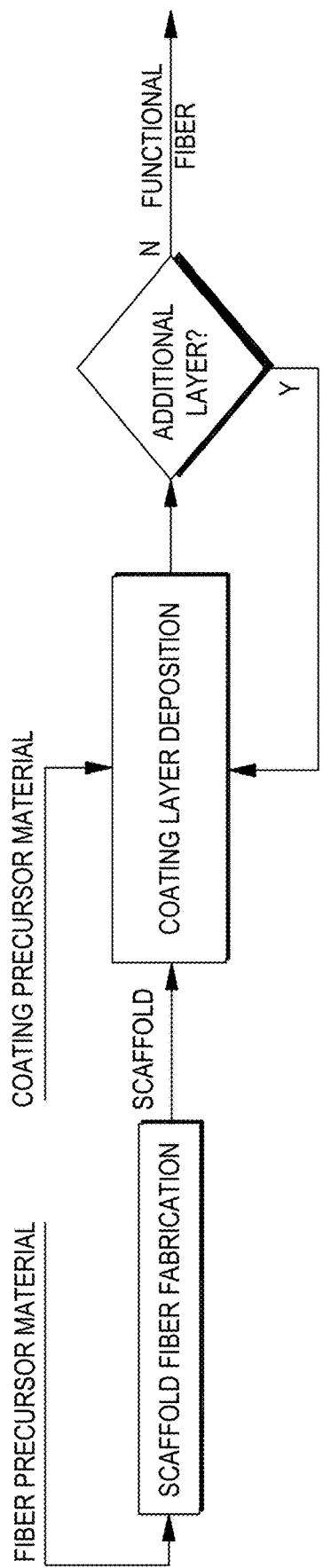
FIG. 14 depicts one embodiment of a process for producing a multilayer functional fiber, in accordance with one or more aspects of the present invention.

FIG. 14 depicts one embodiment of a process for producing a multilayer functional fiber. Note also that, in one or more implementations, the fibers, or one or more portions of the fibers, disclosed herein may be fabricated using the techniques described in PCT Publication No. WO 2013/180764 A1 (which is incorporated herein by reference above). Additionally, in one or more embodiments, the fibers according to any of the above descriptions may be grown on a substrate, either orthogonal to the substrate or at any angle chosen, to create an array of such fibers oriented in some embodiments in a single angle relative to the substrate.

Utilizing any of the above embodiments, fibers can be grown on a substrate using LCVD In fact, fibers need not be continuous either. Massive arrays of short composite fibers with inner structure analogous to the one depicted in FIG. 15 can be derived by parallel deposition onto a base wafer using a reactor according to embodiments detailed above. A fiber array of fibers as illustrated in FIG. 15 can be printed, in some embodiments simultaneously, in order to model an array of these fiber which are implementable in fuel pellet, in some cases directly.

Disclosed herein, thus, is a method for fabricating a fiber structure. The method can include providing a substrate, which may include a refractory material, or a typical wafer type substrate, as well as a fiber structure previously formed according to the below aspects as a substrate, due to the material agnostic abilities of the methods herein described. A plurality of fibers, according to any of the above or below described embodiments, may be grown upon the substrate. Utilizing LCVD and/or 1½D printing, materials such as actinides can be grown as fibers, which was not previously possible. In some embodiments, the fibers can include a first material selected from a group consisting of beryllium, boron, carbon, sodium, magnesium, aluminum, silicon, potassium, calcium, scandium, titanium, vanadium, chromium, manganese, iron, cobalt, nickel, copper, zinc, gallium, arsenic, selenium, rubidium, strontium, yttrium, zirconium, niobium, molybdenum, ruthenium, rhodium, palladium, silver, cadmium, indium, tin, antimony, tellurium, cesium, barium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, yttrium, osmium, iridium, platinum, gold, thallium, lead, bismuth, polonium, francium, radium, actinium, thorium, protactinium, uranium, neptunium, plutonium, americium, curium, berkelium, californium, einsteinium, fermium, nitrogen, oxygen, fluorine, sulfur, chlorine, iodine, mercury and combinations thereof. At least one of the fibers may include uranium Mononitride (UN). Additionally, at least one of the fibers may include triuranium disilicide (U3Si2). As should be clear to one of skill in the art, the plurality of fibers can include at least a first set of fibers of one material, and at least a second set of fibers of a second material. These fibers may be arranged in an array, forming the fiber structure or a part of it. The spacing between fibers is such that neighboring fibers do not occlude lasers during deposition. It can range from twice the diameter of the fibers to the length of the fiber, for instance up to approximately 100 times the diameter of the fibers, wherein the fibers each have approximately the same diameter, or wherein the sets of fibers each within the set of approximately the same diameter. In some embodiments, the diameter may vary across sets of fibers. In some embodiments, a layer may be formed over the fibers including a second material selected from the same group, but being of a different composition that the first material. A matrix material can be provided, surrounding the fibers of the fiber structure. Before or after this, a different material may be grown on the fibers, utilizing LCVD, in part due to the material agnostic ability of the process.

Figure 15:
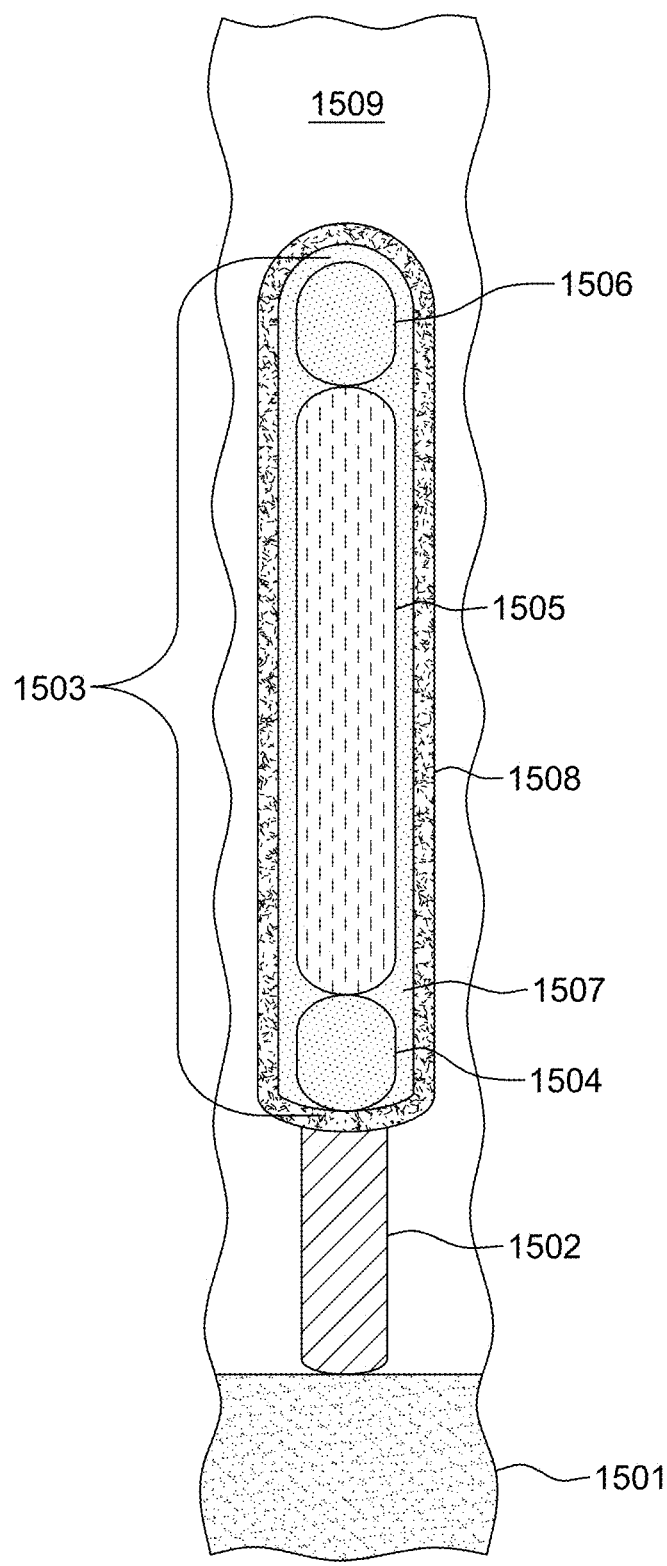
FIG. 15 shows a sample cross-section of a single Fuel Fiber, in accordance with one or more aspects of the present invention.

FIG. 15 illustrates one such fiber, created by embodiments which include a method of growing a fiber structure, in some embodiments an array, of said fibers. Methods disclosed herein may constitute an approach to fuel pellet fabrication which can be incorporated in fuel cells much like advancements were made in integrated microelectronics. The fiber of FIG. 15 illustrates a substrate 1501 upon which a pedestal fiber 1502 is grown. The pedestal fiber 1502 can separate the fibers grown thereon from the substrate, providing an insulative structure for the fibers. Fibers 1503 are grown on the pedestal fiber 1502. In some embodiments, the fibers 1503 can include a first short fiber 1504, a long fiber 1505 on the first short fiber 1504, and a second short fiber 1506 on the long fiber 1505. Due to the material agnostic abilities, each of these grown elements can include different compositions of material, different sizes, or a combination thereof. Additionally, each fiber structure is capable of including a multilayer fiber as described in above embodiments, and can include embedded sensors and/or actuators in some or all of the elements, or across some or all fibers in an array. Deposited around the fiber 1503 is a coating 1507, around which, in some embodiments, is a protective coating 1508. Surrounding fibers 1503 and pedestal fibers 1502, is matrix 1509, according to some embodiments. It should be clear that the fiber of FIG. 15 is one of a set of fibers, which can form an array comprising a fiber structure of such fibers. The fiber as illustrated is not drawn to scale, as the height may be approximately the same as that of a fuel pellet thickness (typically 1-2 cm in some embodiments).

Figure 16:
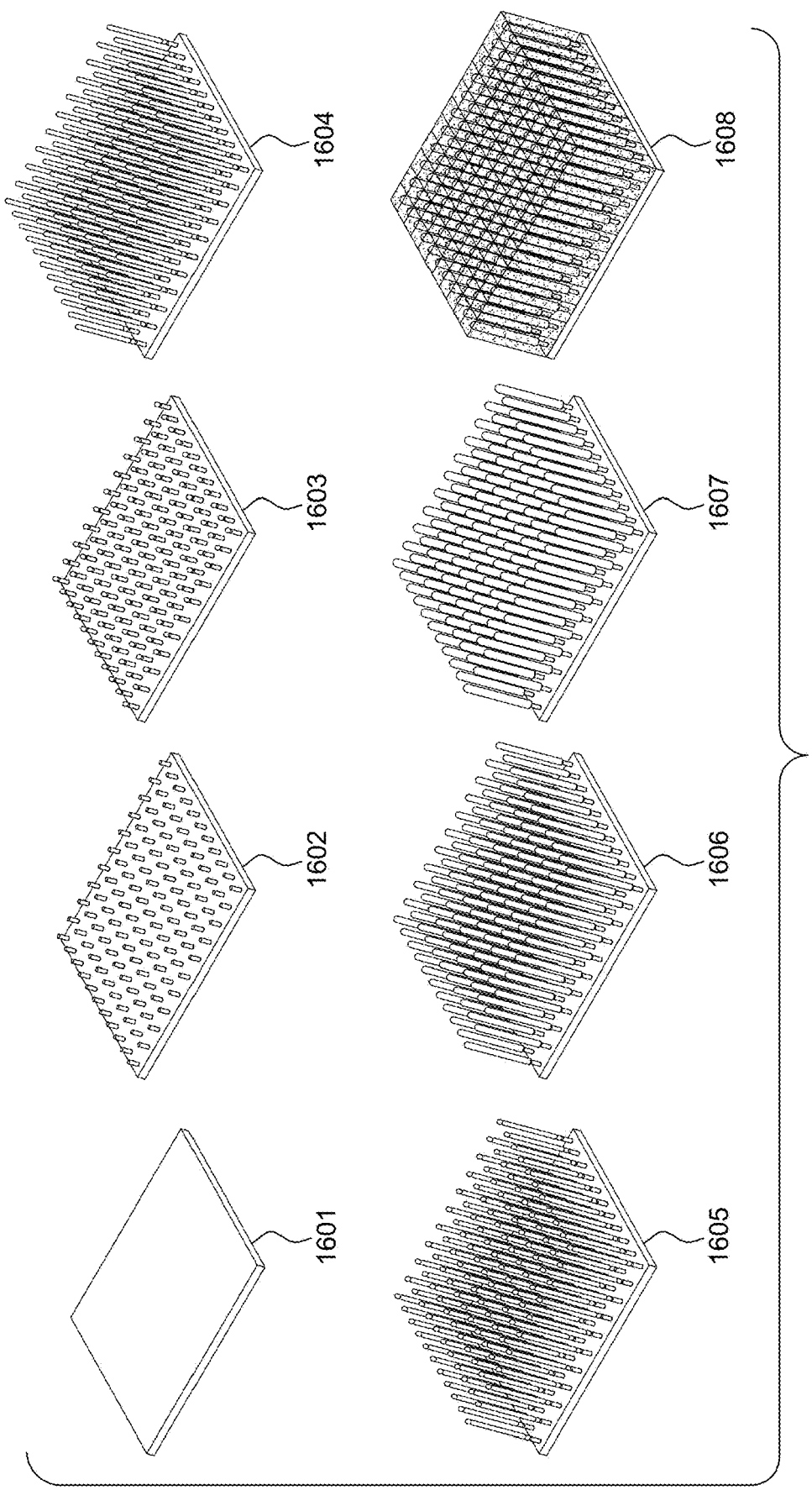
FIG. 16 illustrates a process for forming an rectangular array of fibers, in accordance with one or more aspects of the present invention.

FIG. 16 illustrates a method, according to some embodiments, of the process steps on, for instance, a square sub-section of a circular wafer, with a diameter approximately matching that of the pellet (which may include, in some embodiments, a diameter of 10-15 mm). For clarity, the length scales as shown perpendicular to the wafer have been shrunk according to some embodiments. In certain embodiments, the height after the last process step is to match the pellet thickness. In step 1601, a substrate is provided. The substrate can include a wafer substrate which may be made of a refractory, oxidation resistant, material such as SiC, ZrC, or BeO, or it may include a glass ceramic such as BMAS, BSAS, or Zirconium Silicate. In some embodiments, the substrate is not a flat surface, although not illustrated, and can include fibers previously formed according to embodiments herein described, or any solid surface. In some embodiments, at step 1602, an optional array of pedestal fibers, in one or more embodiments of a refractory material such as C or SiC, are grown upon the substrate. At step 1603, a first set of short fibers, which may be of $U_3Si_2$, are grown on the pedestals, or the substrate if no pedestals are present. At step 1604, long fibers, in one or more embodiments of uranium mononitride (UN), are grown on the first set of short fibers. At step 1605 a second set of short fibers, which can include uranium disilicide ($U_3Si_2$) can be grown on the long fibers, although the second set of short fibers is not necessary. With the pedestal fibers acting as an insulator separating fibers from the substrate, the first and/or second short fibers can act as caps for the fibers. Functionality can include further insulation, or these could be electrodes or storage for the long fiber. At step 1606, the entire structure, minus the pedestals and substrate, may then be coated by depositing a coating surrounding each of the fibers, in some embodiments utilizing LCVD. In one or more embodiments the coating may include $U_3Si_2$. The coating can add functionality of enhance functionality of the fiber. In step 1607, a protective layer may be deposited over the coating. The protective layer may include one or more layers of, for instance, SiC, BeO, or C, according to one or more embodiments of the invention. The protective layer may protect the fibers and/or coating from environmental wear, as well as isolate the fiber structure from its surroundings. At 1608, a matrix material may be provided, surrounding the fibers of the fiber structure. Such matrix material may be a refractory ceramic such as Silicon Carbide, or Zirconium Carbide, a metal such as tungsten, or the matrix may itself be a nanocomposite material, for example a Silicon Carbide whiskers-reinforced Silicon Carbide matrix. In one or more embodiments, another fiber structure may be grown directly on top of the fiber structure following this process, with or without the matrix material being provided. Thus, a previous fiber structure may act as a substrate for further fiber structure fabrication.

While UN and $U_3Si_2$ are described above, the fibers may also utilize any uranium nitride, as well as carbon-molybdenum-uranium and carbon-tungsten-uranium. For instance, uranium tungsten carbide (UWC) and uranium molybdenum carbide (UMoC) can be used when designing a nuclear fuel.

Figure 17A:
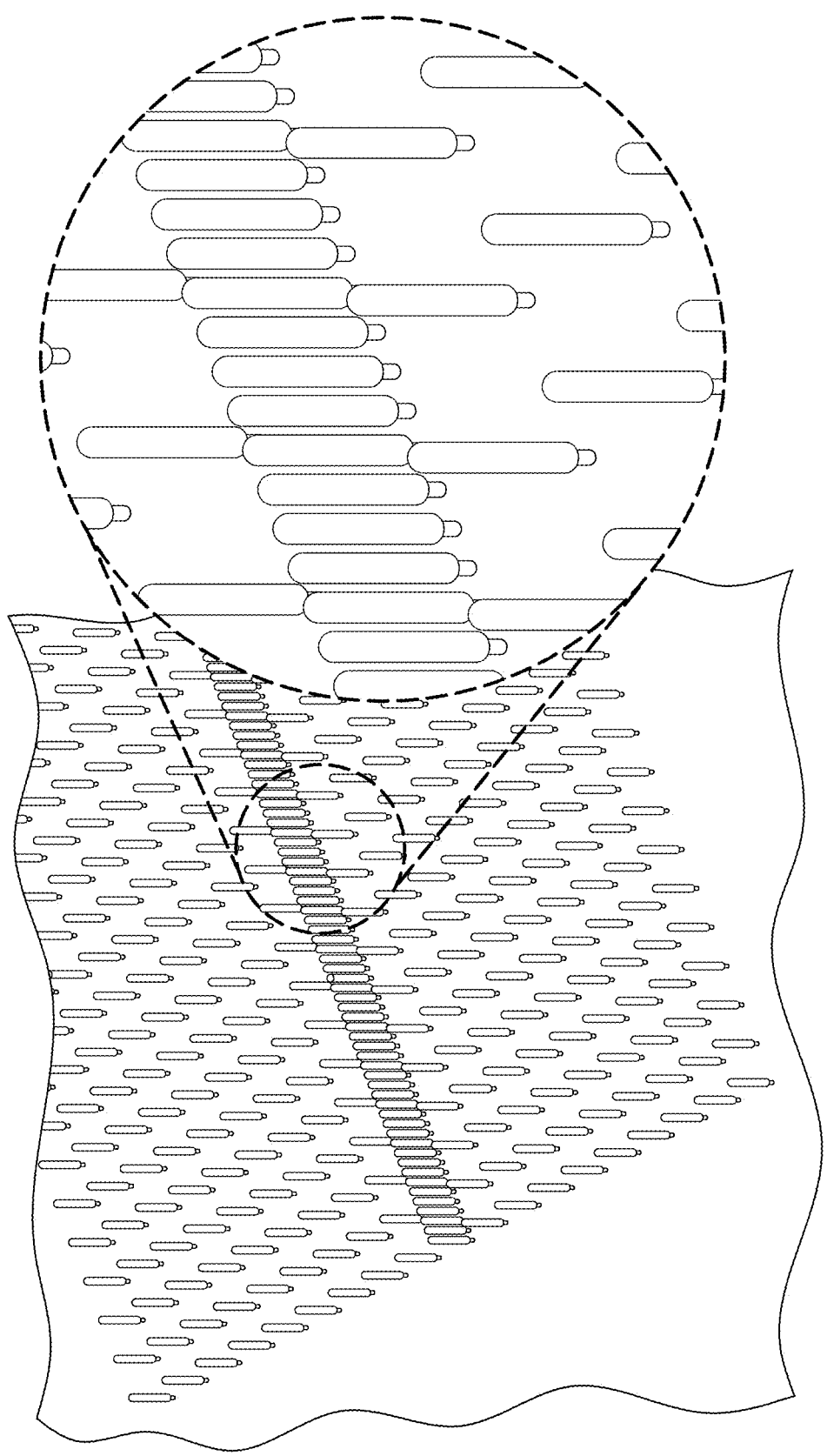
FIG. 17A illustrates an example fiber structure, in accordance with one or more aspects of the present invention.
Figure 17B:
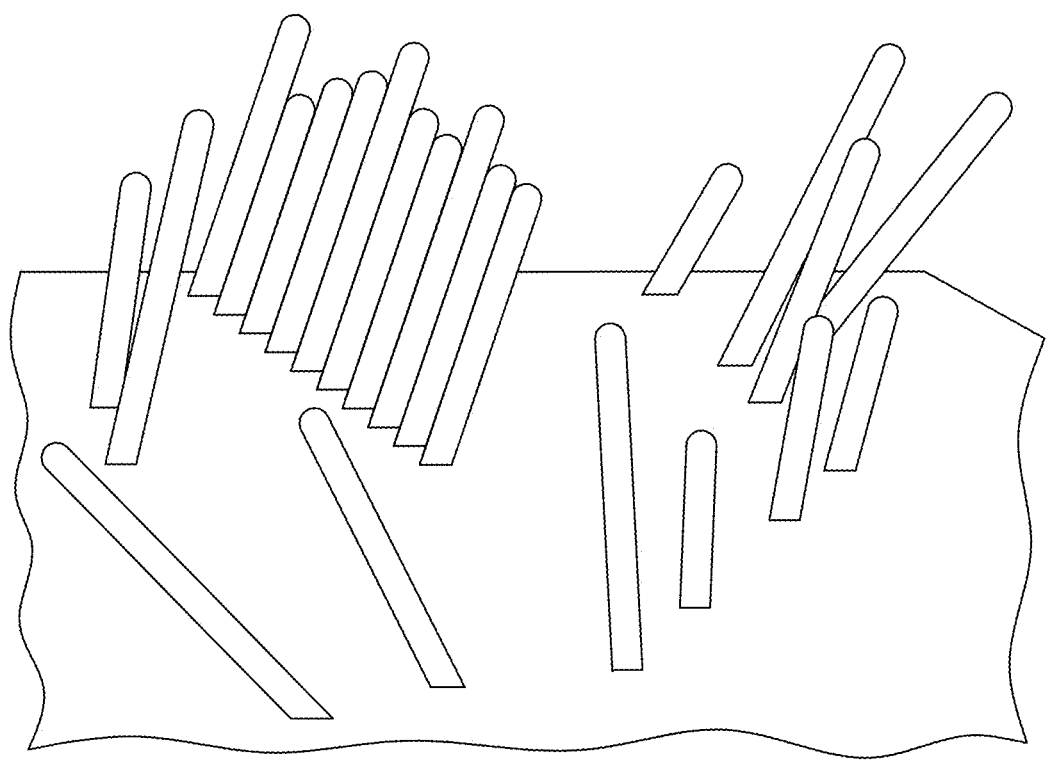
FIG. 17B illustrates an example of fibers grown in multiple directions on a substrate, in accordance with one or more aspects of the present invention.

Any of the above described techniques for varying the size, composition, and coatings of the fibers may be utilized in the method as illustrated in FIG. 16. FIG. 17A illustrates an array of fibers as illustrated in FIG. 15. In FIG. 17A, The spacing between fibers is such that neighboring fibers do not occlude lasers during deposition. It can range from twice the diameter of the fibers to the length of the fiber, in some embodiments approximately 100 times the diameter of the fibers. As illustrated, the fibers can each extend perpendicular to a surface of the wafer. However, as illustrated in FIG. 17B, the fibers may be grown at any angle. Thus, the fiber structure can include fibers oriented in a single or in multiple directions relative to the surface of the substrate. The spacing of the fibers can also vary, being arranged in a single or multiple patterns.

Figure 18:
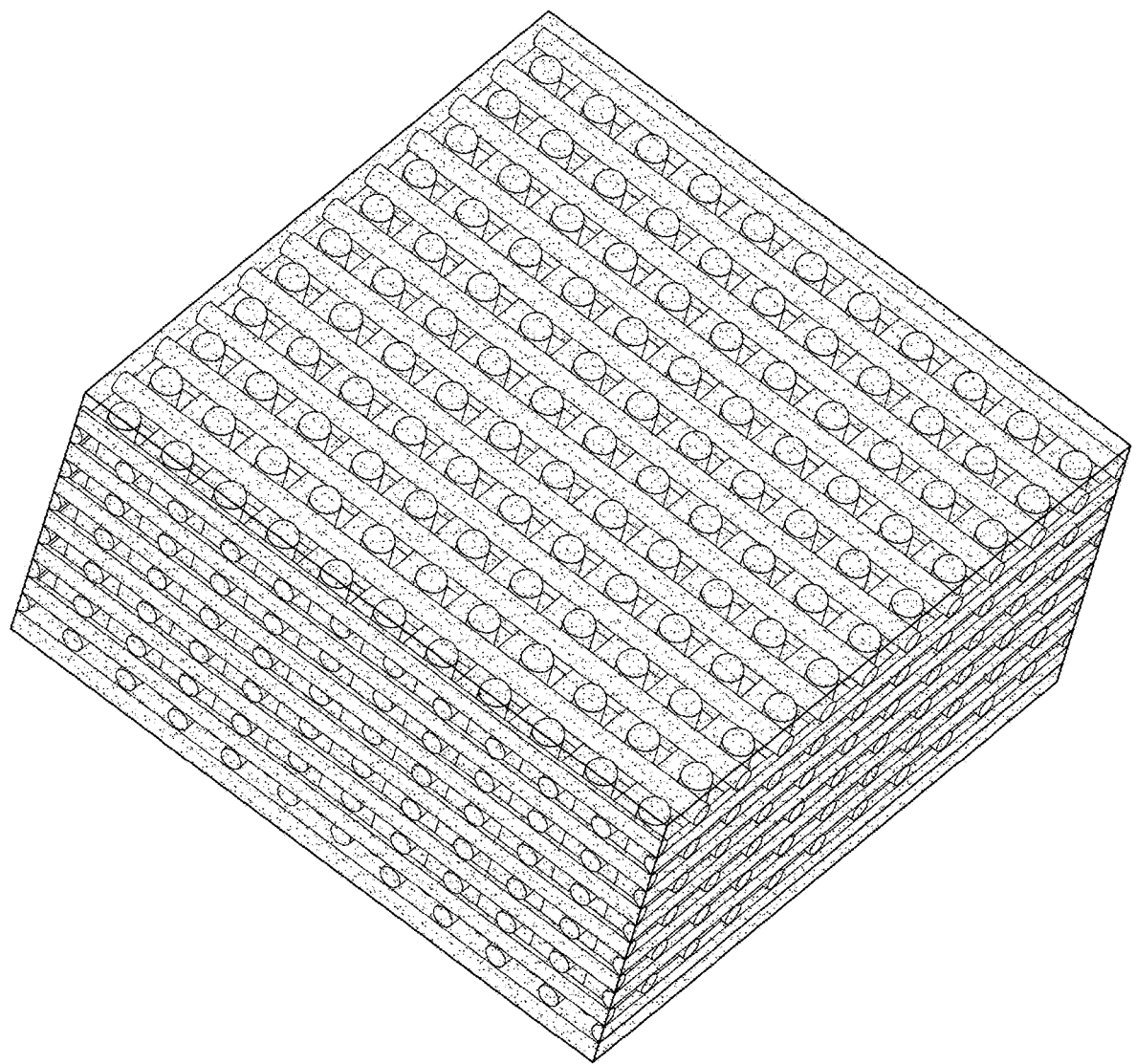
FIG. 18 shows a fiber structure according to aspects of FIG. 16, with the addition of fibers or ribbons between the fibers grown, in accordance with one or more aspects of the present invention.
Figure 19A:
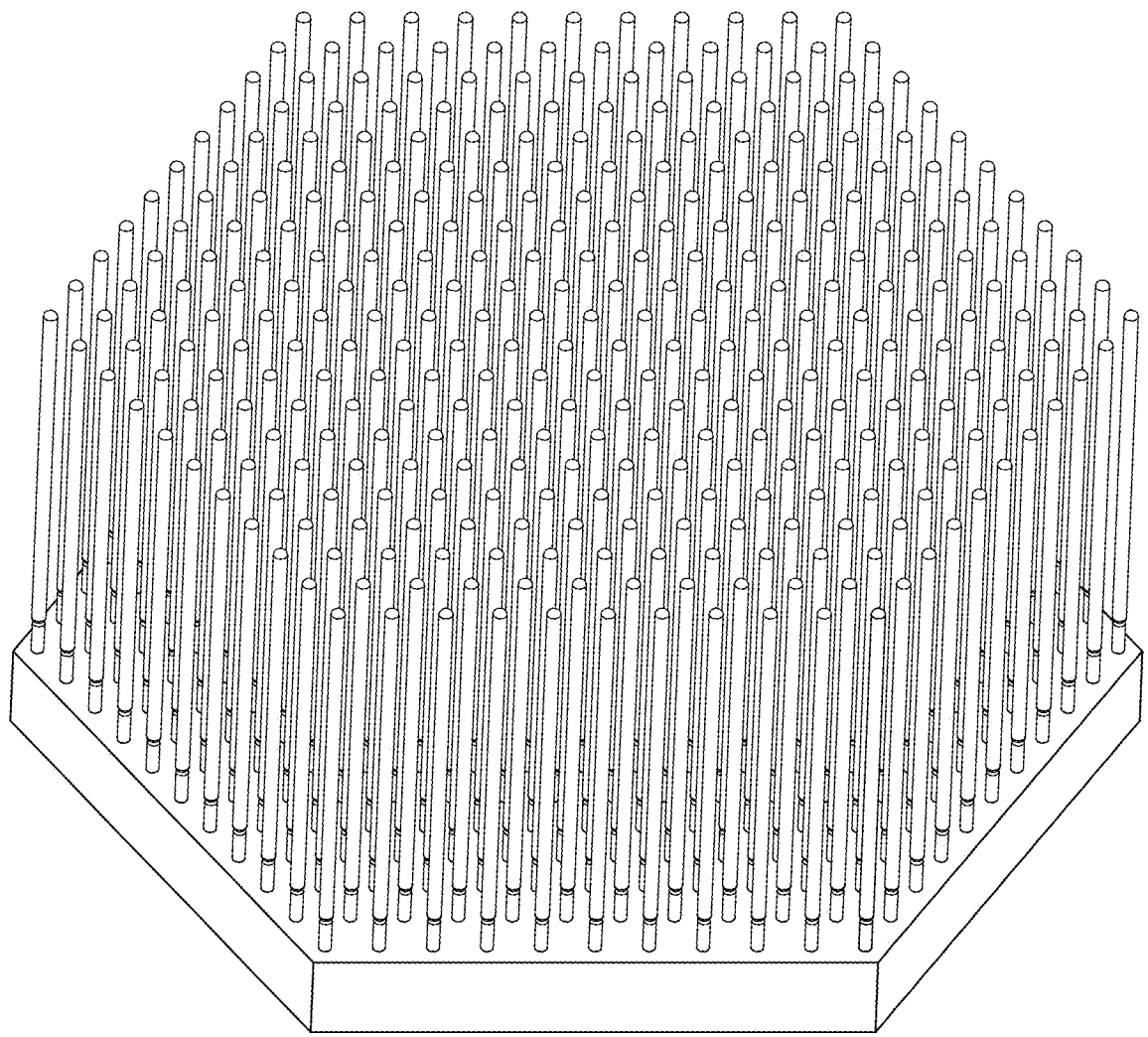
FIG. 19A illustrates a hexagonal array of fibers, in accordance with one or more aspects of the present invention.
Figure 19B:
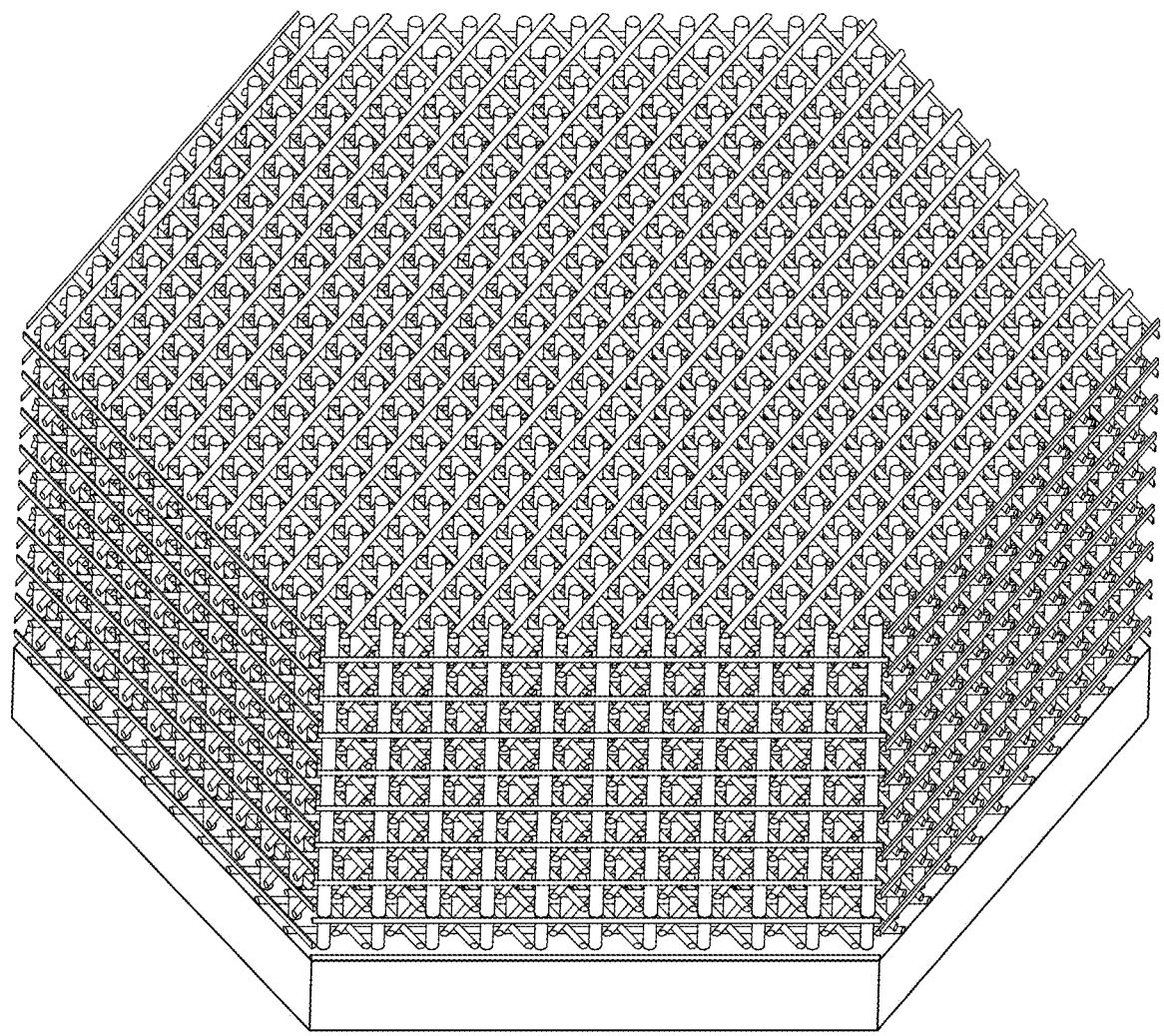
FIG. 19B shows a fiber structure according to aspects of FIG. 19A, with the addition of fibers or ribbons between the fibers grown, in accordance with one or more aspects of the present invention.
Figure 19C:
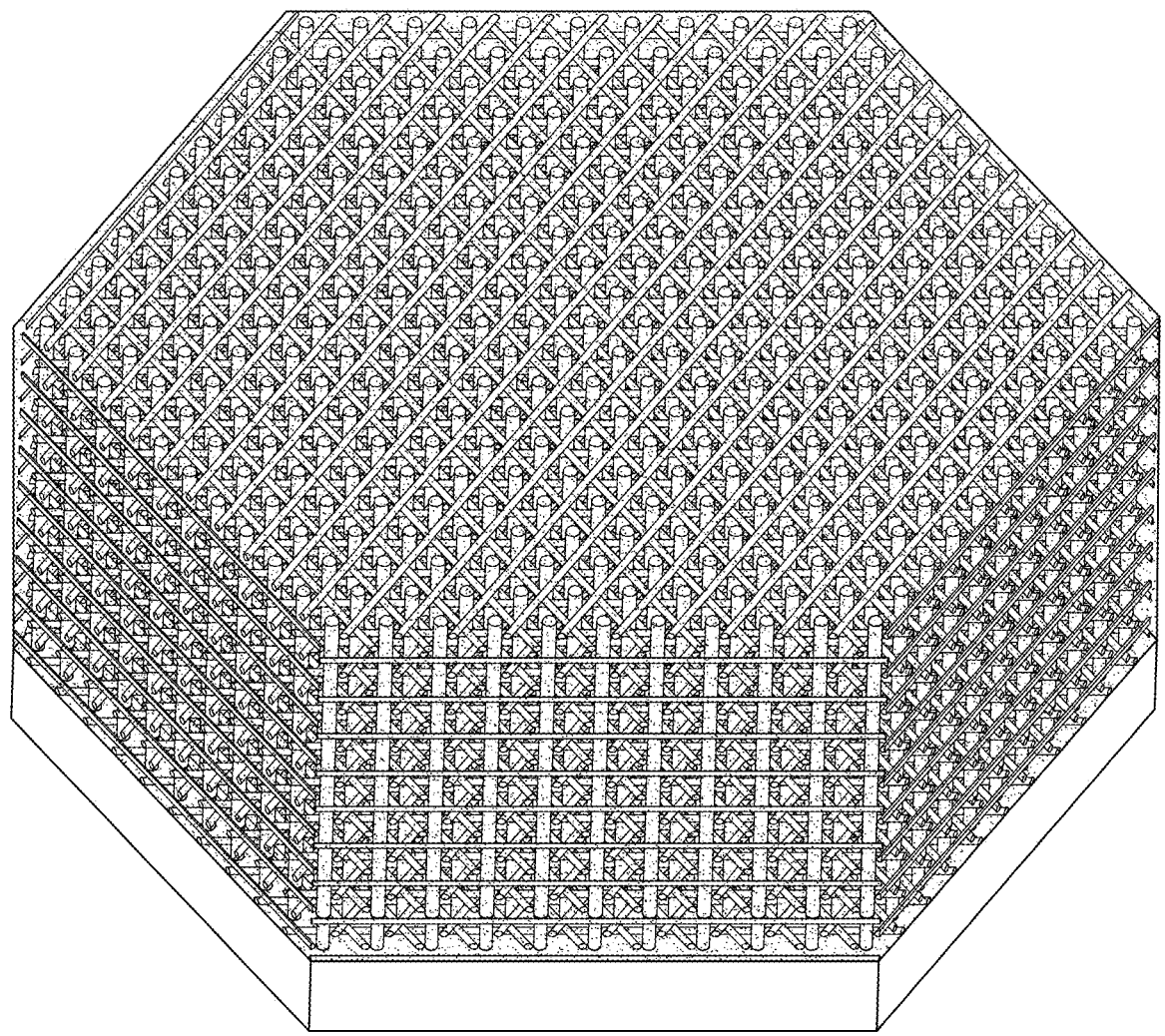
FIG. 19C shows a fiber structure according to aspects of FIG. 19B, with the addition of an embedding matrix.

As illustrated in FIG. 18, once a fiber structure has been grown, and prior to providing the matrix material, the space or some spaces between fibers may be filled with ribbons or fibers, which run in a direction perpendicular to the fibers of the fiber structure, parallel to the surface of the substrate. FIG. 18 illustrates the ribbons or fibers between vertical fibers on a substrate. FIG. 19A illustrates an alternative to FIG. 18, wherein the fibers provide a hexagonal array rather than a square array. FIG. 19B illustrates the ribbons or fibers in a lattice between the fibers for a hexagonal array, with FIG. 19C having a matrix material filled in around the fibers and lattice. The ribbon or fibers can include SiC or other materials at different orientations, for instance at 0-90 or 0, 60, 120, as shown in FIG. 18 and FIG. 19B respectively, which may then be surrounded with a matrix material (FIG. 19C). These ribbons or fibers can act as a network of micro-heat pipes, providing cooling due to the thermal properties of the ribbons or fibers, and can also provide structural reinforcement of the fiber structure, adding strength through the lattice work reinforcing the fiber structure. This 2-D array of refractory fibers which are then surrounded with a refractory matrix, such as SiC, BeO, ZrC, a glass ceramic or a mix thereof for further environmental protection of the fiber structure, and enhancing the structural integrity of the fiber structure. Although illustrated as a square lattice of fiber structure array in FIG. 18, the fiber structure can include any shape, including a hexagonal lattice array as per FIGS. 19A-19C, among others shapes. These arrays may be defined by the shape of the substrate, or there may be multiple arrays defined on the substrate, for instance utilizing some form of isolation, such as deep trench isolation in some embodiments, defining multiple arrays of one or more shapes across a continuous substrate.

The fiber structure illustrated in FIGS. 17A, 17B, 18, and 19A-19C can be useful in high efficiency nuclear fuels and fuel designs, high and ultra-high temperature structural materials, miniaturized or lightweight nuclear thermal propulsion (NTP) solid cores, multifunctional reactor designs, which can allow for integrated health and thermal monitoring as some fiber structures can be designed as sensors as well, and multi-use thermal-electric power. Additionally, sensors, actuators, and other devices can be embedded into the fibers of any fiber structure utilizing the above disclosed methods according to embodiments disclosed therein, for instance, by changing the material of the fibers at any point during the fabrication of the fiber structure, SPOT-COATING, or other methods disclosed above. Multiple types of fibers can be provided in each array, or multiple arrays of different fibers may be utilized. Actuators and/or sensors can be embedded in one or more fibers of one or more arrays, as described above. Thus, vast arrays with multiple uses may be fabricated according to one or more embodiments described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method for fabricating a fiber structure, the method comprising:
   obtaining a supporting substrate;
   growing a pedestal material on the supporting substrate, the growing of the pedestal material defining an array of pedestal fibers extending outward from the supporting substrate, the pedestal fibers of the array of pedestal fibers defined by the pedestal material being insulative structures; and
   growing, according to 1½-D printing, a plurality of standing fibers on the array of pedestal fibers, wherein the plurality of standing fibers extend outward from the array of pedestal fibers, the pedestal material defining the array of pedestal fibers insulating the plurality of standing fibers from the supporting substrate, and the standing fibers being a different material from the pedestal material extending outward from the supporting substrate.

2. The method of claim 1, wherein the 1½-D printing comprises laser chemical vapor deposition growing of the plurality of standing fibers using a plurality of lasers, and wherein the plurality of standing fibers are grown in a densely packed array, the standing fibers having a spacing between standing fibers sufficient to prevent neighboring fibers from occluding one or more lasers of the plurality of lasers or affecting heat and mass transfer sufficient to impact growth of neighboring fibers.

3. The method of claim 2, wherein at least one standing fiber comprises uranium Mononitride (UN).

4. The method of claim 2, wherein at least one standing fiber comprises triuranium disilicide (U3Si2).

5. The method of claim 1, wherein the plurality of standing fibers comprise a first material selected from a group consisting of beryllium, boron, carbon, sodium, magnesium, aluminum, silicon, potassium, calcium, scandium, titanium, vanadium, chromium, manganese, iron, cobalt, nickel, copper, zinc, gallium, arsenic, selenium, rubidium, strontium, yttrium, zirconium, niobium, molybdenum, ruthenium, rhodium, palladium, silver, cadmium, indium, tin, antimony, tellurium, cesium, barium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, yttrium, osmium, iridium, platinum, gold, thallium, lead, bismuth, polonium, francium, radium, actinium, thorium, protactinium, uranium, neptunium, plutonium, americium, curium, berkelium, californium, einsteinium, fermium, nitrogen, oxygen, fluorine, sulfur, chlorine, iodine, mercury and combinations thereof.

6. The method of claim 1, further comprising:
   forming a layer over the plurality of standing fibers, wherein the layer over the plurality of standing fibers comprises a second material selected from a group consisting of beryllium, boron, carbon, sodium, magnesium, aluminum, silicon, potassium, calcium, scandium, titanium, vanadium, chromium, manganese, iron, cobalt, nickel, copper, zinc, gallium, arsenic, selenium, rubidium, strontium, yttrium, zirconium, niobium, molybdenum, ruthenium, rhodium, palladium, silver, cadmium, indium, tin, antimony, tellurium, cesium, barium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, yttrium, osmium, iridium, platinum, gold, thallium, lead, bismuth, polonium, francium, radium, actinium, thorium, protactinium, uranium, neptunium, plutonium, americium, curium, berkelium, californium, einsteinium, fermium, nitrogen, oxygen, fluorine, sulfur, chlorine, iodine, mercury and combinations thereof.

7. The method of claim 1, further comprising:
   surrounding the plurality of standing fibers with an array of fiber ribbons, the fiber ribbons extending parallel to the supporting substrate and running perpendicular to and between the plurality of standing fibers.

8. The method of claim 1, further comprising:
   surrounding the plurality of standing fibers with a matrix material.

9. The method of claim 1, further comprising:
   growing, utilizing 1½- D printing, a different material on the plurality of standing fibers.

10. A method of growing a fiber structure, the method comprising: obtaining a supporting substrate;
    growing a pedestal material on the supporting substrate, the growing of the pedestal material defining an array of pedestal fibers extending outward from the supporting substrate, the pedestal fibers of the array of pedestal fibers defined by the pedestal material being insulative structures;
    growing standing fibers on the pedestal fibers, wherein the standing fibers comprise a different material from the pedestal material defining the pedestal fibers, and wherein the standing fibers and the pedestal fibers all have substantially the same diameter, and wherein the array of pedestal fibers insulate the standing fibers from the supporting substrate; and
    depositing a coating surrounding each of the standing fibers on the pedestal fibers,
    wherein growing the standing fibers on the pedestal fibers comprises growing, using 1 2- D printing, a set of first fibers on the pedestal fibers and growing a set of second fibers on the set of first fibers, wherein the first fibers comprise a different material than the second fibers, and wherein the second fibers are longer than the first fibers.

11. The method of claim 10, wherein the method further comprises: depositing a set of third fibers on the set of second fibers, wherein the third fibers comprise a different material than the second fibers, and wherein the second fibers are longer than the third fibers.

12. The method of claim 10, wherein at least one of the standing fibers comprises uranium disilicide (U3 Si2) or uranium mononitride (UN) and wherein the coating comprises uranium disilicide (U3 Si2).

13. The method of claim 10, further comprising depositing a protective layer over the coating.

14. The method of claim 10, wherein the substrate comprises a refractory material or a glass ceramic.

15. The method of claim 10, wherein the pedestal fibers comprise a refractory material grown upon the supporting substrate.

\* \* \* \* \*

UNITED STATES PATENT AND TRADEMARK OFFICE
CERTIFICATE OF CORRECTION

PATENT NO. : 11,362,256 B2
APPLICATION NO. : 16/019839
DATED : June 14, 2022
INVENTOR(S) : Pegna et al.

It is certified that error appears in the above-identified patent and that said Letters Patent is hereby corrected as shown below:

In the Claims

Column 22, Line 52: Claim 10, Delete "using 1 2- D printing" and insert -- using 1 ½ - D printing --

Signed and Sealed this
Nineteenth Day of July, 2022

Katherine Kelly Vidal
*Director of the United States Patent and Trademark Office*